United States Patent
Song et al.

(10) Patent No.: US 11,741,886 B2
(45) Date of Patent: Aug. 29, 2023

(54) DISPLAY APPARATUS AND METHOD OF MANUFACTURING THE SAME

(71) Applicant: Samsung Electronics Co., Ltd., Suwon-si (KR)

(72) Inventors: Seunghyun Song, Suwon-si (KR); Sangtae Han, Seoul (KR); Huigyeong Ahn, Suwon-si (KR); Changsun Kang, Suwon-si (KR); Mijin Kim, Suwon-si (KR); Seongjun Kim, Suwon-si (KR); Changjun Park, Suwon-si (KR); Seunghee Oh, Suwon-si (KR); Kyoree Lee, Suwon-si (KR); Mihyun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/712,687

(22) Filed: Apr. 4, 2022

(65) Prior Publication Data
US 2022/0246089 A1    Aug. 4, 2022

Related U.S. Application Data

(63) Continuation of application No. PCT/KR2022/001737, filed on Feb. 4, 2022.

(30) Foreign Application Priority Data

Feb. 4, 2021  (KR) .................. 10-2021-0016361
Nov. 19, 2021 (KR) .................. 10-2021-0160727

(51) Int. Cl.
    *G09G 3/32*    (2016.01)
(52) U.S. Cl.
    CPC ....... *G09G 3/32* (2013.01); *G09G 2300/0408* (2013.01); *G09G 2300/0439* (2013.01); *G09G 2310/0275* (2013.01)

(58) Field of Classification Search
    CPC ............ G09G 2300/0408; G09G 3/32; G09G 2310/0275; G09G 2300/0439;
    (Continued)

(56) References Cited

U.S. PATENT DOCUMENTS 9,691,793 B2 *  6/2017  Ma .................. H01L 27/124
9,916,788 B2    3/2018  Tokunaga et al.
(Continued)

FOREIGN PATENT DOCUMENTS

CN    111933630 A    11/2020
JP    6232594 B2     11/2017
(Continued)

OTHER PUBLICATIONS

International Search Report and written opinion dated May 19, 2022, issued in International Application No. PCT/KR2022/001737.

*Primary Examiner* — Muhammad N Edun
(74) *Attorney, Agent, or Firm* — Jefferson IP Law, LLP

(57) ABSTRACT

A display apparatus is provided. The display apparatus includes a substrate having a data line disposed thereon, a plurality of pixel modules arranged in a matrix format on the substrate, and a driver providing a digital data signal through the data line to each of the pixel modules. Each of the pixel modules may include a light emitting layer in which a plurality of light emitting diode (LED) devices form a pixel, a driving layer comprising a display driver integrated circuit (DDI) below the light emitting layer and generating a driving signal to drive the LED devices, and a substrate layer, between the driving layer and the substrate, comprising a data input pad to receive the data signal and transmit the data signal to the DDI and a data output pad to provide the data signal to another adjacent pixel module.

20 Claims, 24 Drawing Sheets

(58) Field of Classification Search
CPC .......... G09G 2300/0452; H01L 25/167; H01L 33/62; H01L 33/0095; H01L 25/0753; H01L 33/54; H01L 33/56
See application file for complete search history.

(56) References Cited

U.S. PATENT DOCUMENTS

| | | | |
|---|---|---|---|
| 10,453,759 | B2 | 10/2019 | Iguchi |
| 10,457,359 | B1 | 10/2019 | Epps et al. |
| 10,483,253 | B1 | 11/2019 | Hu |
| 10,665,578 | B2 | 5/2020 | Huitema et al. |
| 10,763,180 | B2 | 9/2020 | Iguchi |
| 10,939,557 | B2 | 3/2021 | Choi et al. |
| 10,950,591 | B2 | 3/2021 | Hu |
| 10,971,410 | B2 | 4/2021 | Iguchi |
| 2017/0069268 | A1 | 3/2017 | Tokunaga et al. |
| 2017/0229096 | A1 | 8/2017 | Huang et al. |
| 2018/0151120 | A1* | 5/2018 | Kim .................... G09G 3/3291 |
| 2018/0254226 | A1 | 9/2018 | Iguchi |
| 2019/0096864 | A1 | 3/2019 | Huitema et al. |
| 2019/0206330 | A1* | 7/2019 | Kim .................... G09G 3/3283 |
| 2019/0326267 | A1 | 10/2019 | Han et al. |
| 2019/0333901 | A1 | 10/2019 | Cok et al. |
| 2019/0378770 | A1 | 12/2019 | Iguchi |
| 2020/0154572 | A1 | 5/2020 | Choi et al. |
| 2020/0211477 | A1* | 7/2020 | Lai ....................... G09G 3/3258 |
| 2020/0258875 | A1 | 8/2020 | Hu |
| 2020/0343148 | A1 | 10/2020 | Iguchi |
| 2021/0028156 | A1 | 1/2021 | Kang et al. |
| 2021/0167055 | A1 | 6/2021 | Kang et al. |
| 2021/0375833 | A1 | 12/2021 | Lee et al. |
| 2022/0199952 | A1* | 6/2022 | Jang ....................... H10K 59/18 |

FOREIGN PATENT DOCUMENTS

| | | |
|---|---|---|
| JP | 6415736 B2 | 10/2018 |
| JP | 2020-057015 A | 4/2020 |
| KR | 10-2017-0121327 A | 11/2017 |
| KR | 10-2019-0006430 A | 1/2019 |
| KR | 10-2019-0082683 A | 7/2019 |
| KR | 10-2019-0123426 A | 11/2019 |
| KR | 10-2020-0054732 B2 | 5/2020 |
| KR | 10-2020-0106929 A | 9/2020 |
| KR | 10-2021-0012516 A | 2/2021 |
| KR | 10-2021-0067695 A | 6/2021 |
| WO | 2014/099499 A | 6/2014 |
| WO | 2019/208919 A1 | 10/2019 |

* cited by examiner

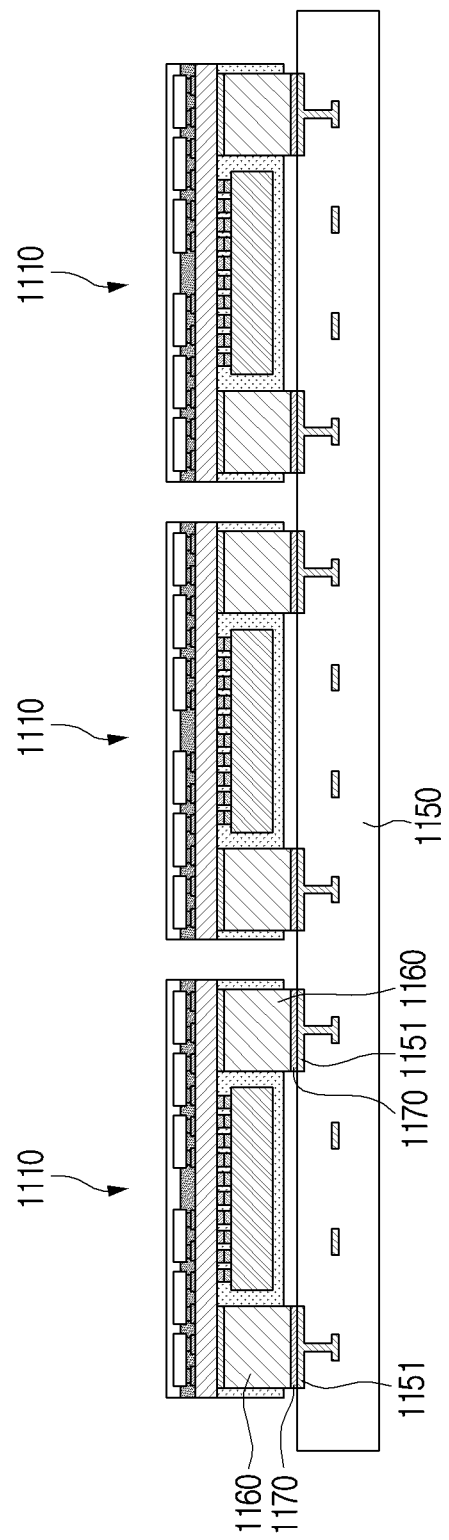

DISPLAY APPARATUS AND METHOD OF MANUFACTURING THE SAME

CROSS-REFERENCE TO RELATED APPLICATION(S)

This application is a continuation application, claiming priority under § 365(c), of an International application No. PCT/KR2022/001737, filed on Feb. 4, 2022, which is based on and claims the benefit of a Korean patent application number 10-2021-0016361, filed on Feb. 4, 2021, in the Korean Intellectual Property Office, and of a Korean patent application number 10-2021-0160727, filed on Nov. 19, 2021, in the Korean Intellectual Property Office, the disclosure of each of which is incorporated by reference herein in its entirety.

TECHNICAL FIELD

The disclosure relates to a display apparatus and a manufacturing method thereof. More particularly, the disclosure relates to a display apparatus including a plurality of pixel modules and a manufacturing method thereof.

BACKGROUND ART

A display apparatus is an output device which expresses various colors by the operation of a pixel or a sub-pixel unit. According to the technology development, there is a need for a display apparatus with large size and high definition, and research has been continued to improve manufacturing yield.

A light emitting diode (LED) panel, among display apparatuses is an inorganic light emitting panel that emits light without a color filter and a backlight, and is widely used as a light source for various display apparatuses such as a television (TV), a mobile phone, a monitor, a laptop, or the like.

The display apparatus may use an active matrix (AM) driving method or a passive matrix (PM) driving method to control a plurality of pixels, and the driving methods may provide a data signal through a data line for a plurality of light emitting devices in an analog manner to control the brightness and color of a pixel.

In this driving method, the base substrate of the display apparatus has been implemented as a multi-layer substrate for wiring, and the multi-layer substrate may have problems of increase in the manufacturing difficulty, decrease in yield is in a patterning process of a substrate, and rise in a manufacturing cost of the substrate.

The above information is presented as background information only to assist with an understanding of the disclosure. No determination has been made, and no assertion is made, as to whether any of the above might be applicable as prior art with regard to the disclosure.

DISCLOSURE

Technical Problem

Aspects of the disclosure are to address at least the above-mentioned problems and/or disadvantages and to provide at least the advantages described below. Accordingly, an aspect of the disclosure is to provide a display apparatus and a method of manufacturing thereof for transferring a plurality of pixel modules including a display driver integrated circuit (DDI) on a base substrate, thereby improving the manufacturing difficulty and manufacturing yield of the base substrate and a method for manufacturing thereof.

Additional aspects will be set forth in part in the description which follows and, in part, will be apparent from the description, or may be learned by practice of the presented embodiments.

Technical Solution

In accordance with an aspect of the disclosure, a display apparatus is provided. The display apparatus includes a base substrate having a data line disposed on one side, a plurality of pixel modules arranged in a matrix format on one side of the base substrate, and a driving driver configured to provide a data signal in a digital format through the data line to each of the plurality of pixel modules, and each of the plurality of pixel modules may include a light emitting layer in which a plurality of light emitting diode (LED) devices are disposed to form a pixel, a driving layer comprising a display driver integrated circuit (DDI) formed below the light emitting layer configured to generate a driving signal to drive the plurality of LED devices, and a substrate layer, formed between the driving layer and the base substrate, comprising a data input pad configured to receive the data signal and transmit the data signal to the DDI and a data output pad configured to provide the data signal to another adjacent pixel module.

The data line may include a plurality of sub data lines configured to transmit the data signal from a data output pad of one pixel module among the plurality of pixel modules to a data input pad of another adjacent pixel model.

The plurality of sub data lines may be segmented from each other and spaced apart from each other on the base substrate distantly.

The display apparatus may include a power line configured to supply power to the plurality of pixel modules, and the power line and the data line may be provided on a wiring layer formed on one side of the base substrate.

The power line and the data line may be provided on the wiring layer so that the base substrate has a one-layer structure The wiring layer may include the plurality of sub data lines being segmented and distantly disposed in a row direction in the matrix format, and the power line being arranged in a column direction in the matrix format.

The power line may be disposed between the plurality of sub data lines.

The substrate layer may include a first layer facing the base substrate and having the data input pad and the data output pad being located therein, a second layer located on an opposite side of the first side and facing the driving layer, and an intermediate layer in which a plurality of via holes that pass through the first layer and the second layer.

The intermediate layer may be made of polyimide material, and the substrate layer may include a two-layer structure.

The substrate layer may have thickness between 45 μm and 55 μm.

The driving layer may include a light blocking molding to block transmission of light, and the light blocking molding may be coated on an upper surface of the DDI.

The light blocking molding may be implemented as a black color to block light.

Each of the plurality of pixel modules may include a plurality of red LED (R-LED) devices, a plurality of green LED (G-LED) devices, and a plurality of blue LED (B-LED) devices, and one pixel module may form a plurality of pixels.

The base substrate may be a flexible printed circuit board (FPCB) of which at least a portion has flexibility.

According to various embodiments, a method of manufacturing a display apparatus may include forming a substrate comprising a data input pad configured to receive the data signal and a data output pad configured to provide a data signal, transferring a display driver integrated circuit (DDI) to an upper surface of the substrate layer, coating a light blocking molding onto the upper surface of the substrate layer and the upper surface of the DDI, and forming a driving layer by wiring a plurality of light emitting diode (LED) devices to be bonded, forming a light emitting layer by mounting the plurality of LED devices on the driving layer, and transferring a plurality of pixel modules formed of the substrate layer, the driving layer, and the light emitting layer to a base substrate in a matrix form.

The method for manufacturing the display apparatus may include distantly disposing a plurality of sub data lines segmented from each other on the base substrate before transferring the data signal to the base substrate, wherein the plurality of sub data lines may transmit the data signal from a data output pad of one pixel module among the plurality of pixel modules to a data input pad of adjacent another pixel module.

The distant disposing of the plurality of sub data lines may include distantly disposing the plurality of sub data lines on the base substrate in a row direction in the matrix format, and disposing the power line in a column direction in the matrix format.

The distant disposing of the plurality of sub data lines may include disposing the power line between a space where the plurality of sub data lines are spaced apart from each other.

The forming the substrate layer may form a substrate layer including a first layer facing the base substrate and having the data input pad and the data output pad being located therein, a second layer located on an opposite side of the first side and facing the driving layer, and an intermediate layer in which a plurality of via holes that pass through the first layer and the second layer.

In the forming the substrate layer, the intermediate layer is made of a polyimide material, and the substrate layer may have a thickness between 45 μm and 55 μm.

The pixel module according to various embodiments may include a substrate layer, a light emitting layer in which a plurality of light emitting diode (LED) devices are disposed on a first surface of the substrate layer to form a pixel, a display driver integrated circuit (DDI) for generating a driving signal to drive the plurality of LED devices on a second surface which is opposite to the first surface of the substrate layer, a driving layer including a plurality of wiring members disposed on the second surface of the relay substrate, and a molding which may cover up the DDI and cover so that a part of the plurality of wiring members is exposed.

The plurality of wiring members may be formed of a pillar shape. In this example, a cross-section of the pillar shape may be of circular, oval, or polygonal shape.

The plurality of wiring members may be formed of a ball shape.

The plurality of wiring members may be copper (Cu), aluminum (Al), tin (Sn), or iron (Fe), or an alloy including one of these.

The plurality of wiring members may have a length that corresponds to or longer than the upper surface of the DDI from the second surface of the substrate layer.

The plurality of wiring members may further include a connection layer in each end portion. The connection layer may be tin (Sn), silver (Ag), indium (In), aluminum (Al), or zinc (Zn), or an alloy including one of these.

In accordance with another aspect of the disclosure, a display apparatus is provided. The display apparatus includes a base substrate having a data line disposed on one side, a plurality of pixel modules arranged in a matrix format on one side of the base substrate, and a driving driver configured to provide a data signal in a digital format through the data line to each of the plurality of pixel modules, and each of the plurality of pixel modules may include a substrate layer, a light emitting layer in which a plurality of light emitting diode (LED) devices are disposed on a first surface of the substrate layer to form a pixel, a display driver integrated circuit (DDI) for generating a driving signal to drive the plurality of LED devices on a second surface which is opposite to the first surface of the substrate layer, a driving layer including a plurality of wiring members disposed on the second surface of the relay substrate, and a molding which may cover up the DDI and cover so that a part of the plurality of wiring members is exposed.

In accordance with another aspect of the disclosure, a method of manufacturing a display apparatus is provided. The method includes forming a substrate comprising a data input pad configured to receive the data signal and a data output pad configured to provide a data signal, transferring a display driver integrated circuit (DDI) to an upper surface of the substrate layer, after mounting a plurality of wiring members on one side of the substrate layer, forming a driving layer by covering the DDI on one side of the substrate layer and forming a molding to expose an end portion of the plurality of wiring members, mounting a plurality of light emitting diode (LED) devices on another side of the substrate to form the light emitting layer, and transferring a plurality of pixel modules formed of the substrate layer, the driving layer, and the light emitting layer to a base substrate.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which:

FIG. 13 is a cross-sectional view illustrating a method of manufacturing a display apparatus according to an embodiment of the disclosure.

Throughout the drawings, it should be noted that like reference numbers are used to depict the same or similar elements, features, and structures.

MODE FOR INVENTION

Figure 1:
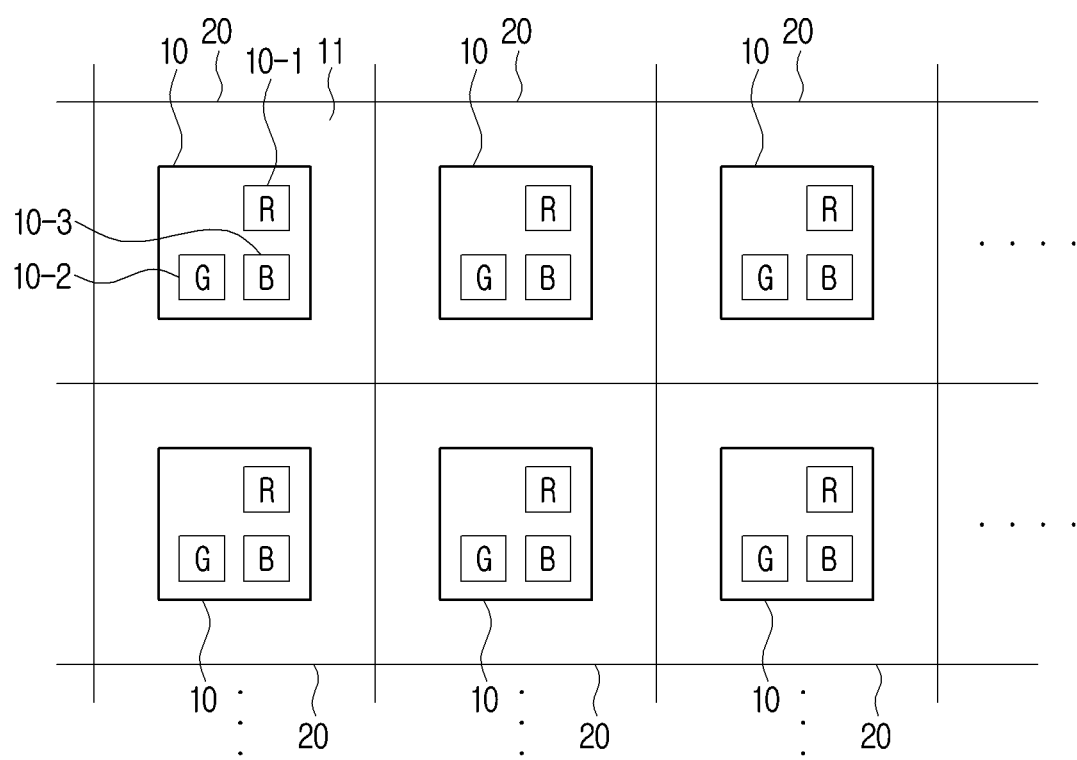
FIG. 1 is a diagram illustrating a pixel structure of a display apparatus according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In this disclosure, the terms first, second, etc. may be used to describe various components, but these components are not limited by the terms discussed above. The terms described above are used only to distinguish one component from another component. For example, a first component may be termed a second component without departing from the scope of the disclosure of the disclosure, and similarly a second component may also be termed a first component.

It will be further understood that terms "include" or "formed of" used in the present specification specify the presence of features, numerals, steps, operations, components, parts, or combinations thereof mentioned in the present specification, but do not preclude the presence or addition of one or more other features, numerals, steps, operations, components, parts, or combinations thereof.

The term such as "module," "unit," "part," and so on is used to refer to an element that performs at least one function or operation, and such element may be implemented as hardware or software, or a combination of hardware and software. Further, except for when each of a plurality of "modules," "units," "parts," and the like need to be implemented in an individual hardware, the components may be integrated in at least one module or chip and implemented in at least one processor.

Hereinafter, non-limiting example embodiments of the disclosure will be described in detail with reference to the accompanying drawings so that those skilled in the art to which the disclosure pertains may easily practice the disclosure. However, the disclosure may be implemented in various different forms and is not limited to embodiments described herein. In addition, in the drawings, portions unrelated to the description will be omitted, and similar portions will be denoted by similar reference numerals throughout the specification.

Further, the embodiments have been described in detail below with reference to the accompanied drawings and the descriptions to the accompanied drawings, but it should be understood that the disclosure is not limited by the embodiments.

With reference to FIGS. 1 to 4, 5A to 5C, 6 to 8, 9A to 9D, and 10, a display panel and a display apparatus of the disclosure will be described in detail.

FIG. 1 is a diagram illustrating a pixel structure of a display apparatus according to an embodiment of the disclosure.

Referring to FIG. 1, a display apparatus 100 of various embodiments may include a plurality of pixels 10 arranged in a matrix format.

The display apparatus 100 is an outputting apparatus that includes a display panel 103 and a processor 105 controlling the same, and represents various colors while operating the display panel 103 in a unit of a pixel 10 or sub-pixels 10-1, 10-2, 10-3. The display panel 103 may include a base substrate 150, a light emitting device 200, and a driving circuit 210 driving the light emitting device 200.

The display panel 103 may include an inorganic light emitting diode or a micro light emitting diode as the light emitting device 200, and may display an image to a plurality of light emitting devices 200. According to an embodiment, the display panel 103 may include a plurality of inorganic light emitting diodes, provide better sharpness and luminance compared to a liquid crystal display (LCD) panel requiring a backlight, reduce response time, and increasing energy efficiency, and improve energy efficiency.

The micro LED may refer to an ultra-small LED having a size in a micrometer unit of less than a general light emitting diode chip. The micro LED is manufactured in the form of a chip on a wafer (growth substrate) through an epitaxial process, and is transferred onto a target substrate to form a display panel 103, and the light emitting device 200 including the LED to the micro LED according to an embodiment may have a structure that is mounted on the plurality of pixel modules 110 and is transferred to the base substrate 150.

The light emitting device 200 of the display apparatus 100 of the disclosure may be an LED device or a micro LED device, which will be referred to as "light emitting device" below.

The display panel 103 according to various embodiments may be installed and applied in a single unit to a wearable device, a portable device, a handheld device, or electronic products or electronic parts that require various displays, and a plurality of display modules each including the display panel 103 may be applied as a matrix type to various display apparatuses 100 such as a personal computer (PC) monitor, high-resolution TVs and signage (or digital signage), electronic display, or the like.

The display panel 103 may include a plurality of pixels 10 arranged in a matrix form, and each pixel 10 may include a plurality of sub-pixels 10-1, 10-2, and 10-3. For example, each of the plurality of pixels 10 may include three types of sub-pixels 10-1, 10-2, and 10-3 including a red sub-pixel 10-1, a green sub-pixel 10-2, and a blue sub-pixel 10-3. That is, a set of R, G, and B sub-pixels 10-1, 10-2, and 10-3 may form one unit pixel 10 of the display panel 103.

According to an embodiment, the order of subpixels 10-1, 10-2, 10-3 is described as R, G, B, but is not actually placed in R, G, or B order within the pixel 10, and in describing of this disclosure, a plurality of subpixels 10-1, 10-2, 10-3 or a plurality of light emitting devices 200-1, 200-2, 200-3 (see FIG. 3), reference numerals are described in the order of R, G, and B, which is for convenience, and the order in which devices such as light emitting devices and driving circuits are placed may be the same or different.

One pixel region 20 of the display panel 103 may include a region occupied by the pixel 10 and a remaining region 11 around the region occupied by the pixel 10. In detail, the region occupied by the pixel 10 may include R, G, and B sub-pixels 10-1, 10-2, and 10-3, and the R sub-pixel 10-1 may include a red (R) light-emitting device 200-1, a green (G) sub-pixel 10-2 may include a G light-emitting device 200-2, and a blue (B) sub-pixel 10-3 may include the B light-emitting device 200-3.

According to an embodiment, the sub-pixels 10-1 to 10-3 within one pixel 10 may be arranged in the shape of an L-shape in which left and right are reversed. However, the embodiment is not limited thereto and R, G, and B sub-pixels 10-1, 10-2, and 10-3 may be arranged in a row inside the pixel 10, or the plurality of sub-pixels 10-1, 10-2, and 10-3 may be arranged in various forms within each pixel 10.

In the above example, it has been described that one pixel 10 includes three sub-pixels 10-1, 10-2, and 10-3, but the example is not limited thereto, and one pixel 10 may be implemented as four sub-pixels, such as R, G, B, and white (W), or a different number of sub-pixels may constitute one pixel. For convenience of description, an example in which one pixel 10 is composed of three types of sub-pixels such as R, G, and B will be described, but the example is not limited thereto.

Figure 2:
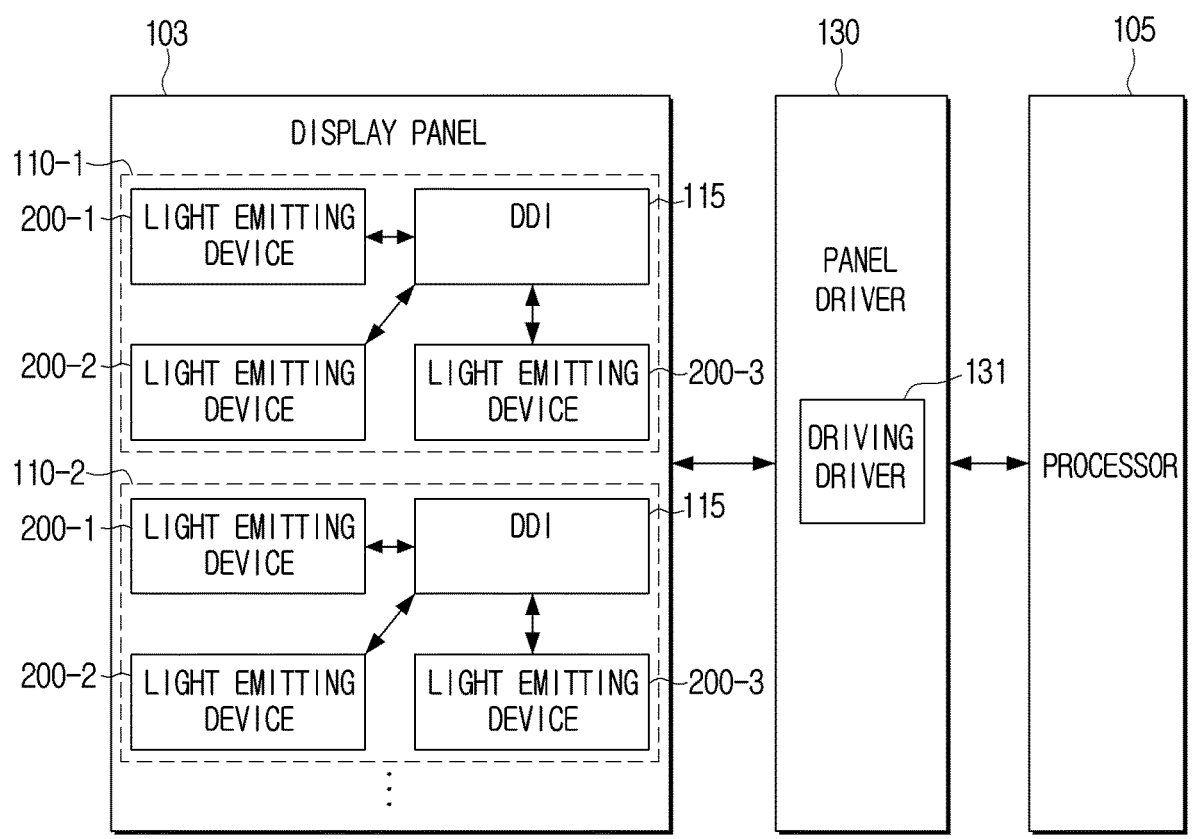
FIG. 2 is a block diagram of a display apparatus according to an embodiment of the disclosure.

FIG. 2 is a block diagram of the display apparatus 100 according to an embodiment of the disclosure.

Referring to FIG. 2, the display apparatus 100 of various embodiments may include a processor 105 and a panel driver 130.

The processor 105 may control the overall operation of the display apparatus 100. The processor 105 may control the panel driver 130, and the panel driver 130 may drive a plurality of light emitting elements 200 of the display panel 103 by controlling the driving of the display panel 103 through the driving driver 131.

The processor 105 according to various embodiments may be implemented by including a central processing unit (CPU), micro-controller, application processor (AP), communication processor (CP), or Advanced reduced instruction set (RISC) Machine (ARM) sensor.

The processor 105 may provide an image signal to the display panel 103. For example, the processor 105 may control the panel driver 130 to set the pulse width of the driving current of the light emitting device 200 according to the pulse width setting voltage, and may set the amplitude of the driving current of the light emitting device 200 according to the amplitude setting voltage.

The processor 105 of the various embodiments may include a plurality of pixel modules 110 of the display panel 103, and the data line 230 (see FIG. 7) may be a circuit wiring for transmitting a data signal between the driving driver 131 and the plurality of pixel modules 110. When the plurality of pixel modules 110 are arranged in a matrix form consisting of n rows and m columns, the panel driver 130 may be controlled so that in matrix type row unit (horizontal line unit) the amplitude of the driving current is controlled through the data line 230 of the data driving unit 135, or the pulse width is set. The processor 105 may apply the driving voltage VDD to the light emitting device 200 through a voltage line 241 that is one of the power lines 241 and 245 in a matrix type column unit (vertical line unit), and the data driving unit 135 may control the panel driver 130 so that a linear change voltage (Sweep voltage) is applied, and the display apparatus 100 may display an image.

The panel driver 130 may control the display panel 103 through the driving driver 131 under the control of the processor 105, and more specifically, may control the driving of the plurality of light emitting devices 200 through the DDI 115 included by the plurality of pixel modules 110. The panel driver 130 may be connected to the plurality of pixel modules 110 through the plurality of pixel modules 110 and the data lines 230 to provide a data signal to the plurality of pixel modules 110. The panel driver 130 may supply power to the plurality of pixel modules 110 through the plurality of pixel modules 110 and the power lines 241 and 245.

The driving driver 131 may include a data driving unit 135, and specific details to control the operation of the panel driver 130 and the display panel 103 by the processor 105 will be described in detail with reference to FIG. 6.

The display panel 103 may include a plurality of pixel modules 110, and each of the plurality of pixel modules 110 may include the DDI 115 and a plurality of light emitting devices 200-1, 200-2, and 200-3, so that the DDI 115 may control the driving of the plurality of mounted driving circuits 210-1 to 210-3 and/or the plurality of light-emitting devices 200-1, 200-2, and 200-3 in units of the pixel module 110.

Hereinafter, a plurality of pixel modules 110 including the display panel 103 of the display apparatus 100 according to various embodiments will be described in detail with reference to FIGS. 3, 4, and 5A to 5C.

Figure 3:
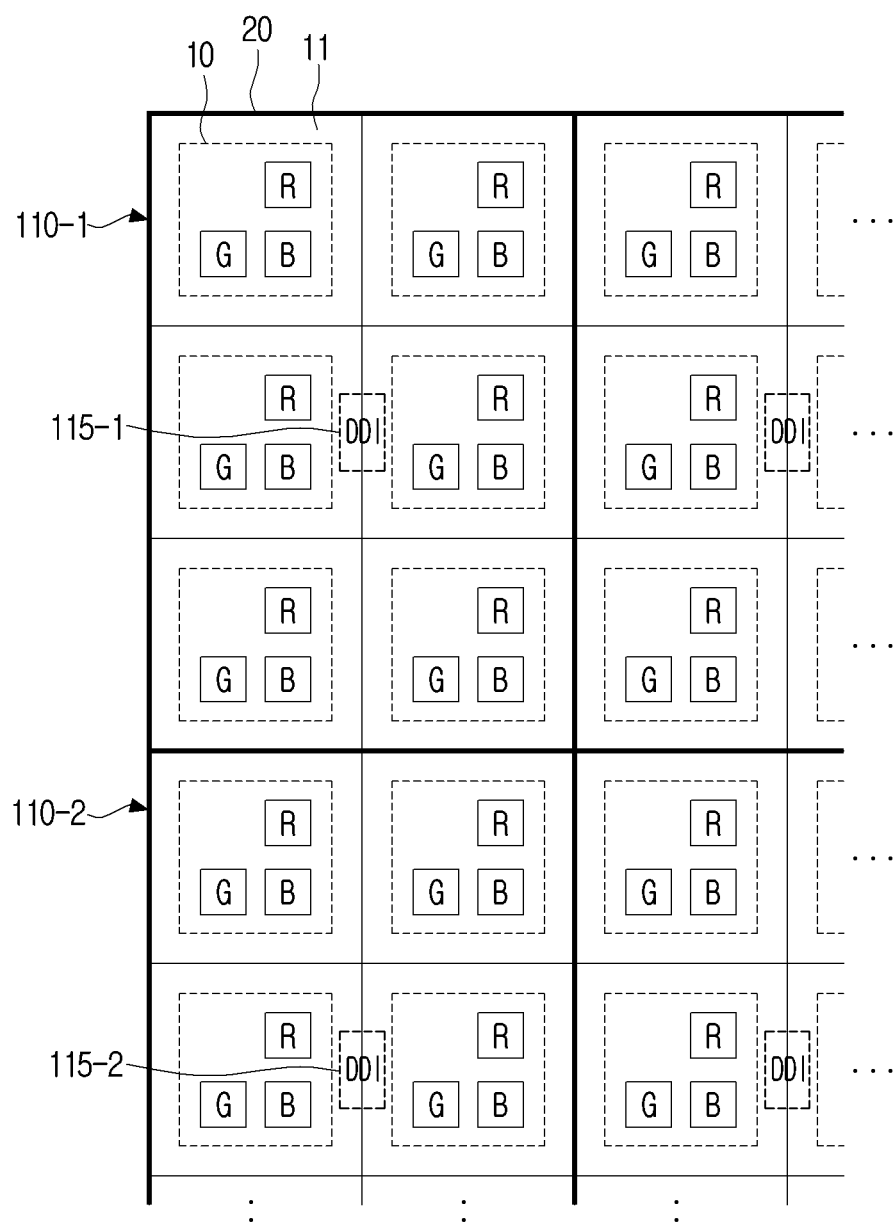
FIG. 3 is a plan view illustrating the arrangement of a plurality of pixel modules according to an embodiment of the disclosure.

FIG. 3 is a plan view illustrating the arrangement of a plurality of pixel modules 110 according to an embodiment of the disclosure.

Referring to FIG. 3, a plurality of pixel modules 110 may include at least one pixel 10 and the DDI 115, and a plurality of pixels 10 may be arranged in a matrix form.

The plurality of pixel modules 110 may include at least one pixel 10. The first pixel module 110-1, which is one of the plurality of pixel modules 110, may include a plurality of pixels 10 and one DDI 115 to control the driving of the plurality of pixels 10. Each of the plurality of pixel modules 110 may include R-LED devices, a plurality of G-LED devices, and a plurality of B-LED devices, and one pixel module 110 may form a plurality of pixels 10.

As shown in FIG. 3, the plurality of pixels 10 included in the pixel module 110 of various embodiments may be six, one pixel 10 may include R, G, and B sub-pixels 10, and the DDI 115 may control the driving of the 18 light emitting devices 200. In the structure where each of the plurality of pixel modules 110 includes the DDI 115 through the above structure, it may be advantageous to secure the space for the arrangement design and assembly of the DDI 115, and the wiring interval may be widely secured in the patterning process of the base substrate 150 for wiring between the plurality of DDIs 115-1, 115-2, etc., thereby increasing productivity in the production process of the display panel 103.

In the following description, one pixel module 110 is described with reference to an embodiment including six pixels 10 and one DDI 115. However, in an actual implementation, the plurality of pixel modules 110 of various embodiments may include one pixel 10 and one DDI 115, and may control the driving of the plurality of light emitting devices 200 by performing a divided role by including two or more DDIs 115-1, 115-2, etc.

The plurality of pixel modules 110 may include a first pixel module 110-1 and a second pixel module 110-2, which may be an arbitrary pixel module, and the plurality of pixel modules 110 may be arranged in a matrix form. The first pixel module 110-1 and the second pixel module 110-2 may be disposed adjacent to each other, coupled or spaced apart from each other. Each of the plurality of pixel modules 110 may be separated from each other based on the driver layer 113 including the DDI 115 or the substrate layer 120 including a plurality of input/output pads 160, 170, and 180.

The DDI 115 may be an integrated circuit for driving each of the plurality of pixel modules 110 of the display panel 103, and convert the digital data signal received through the data line 230 (see FIG. 7) into an RGB analog image signal to apply a voltage to the plurality of light emission to perform an image display operation of the display panel 103.

Figure 4:
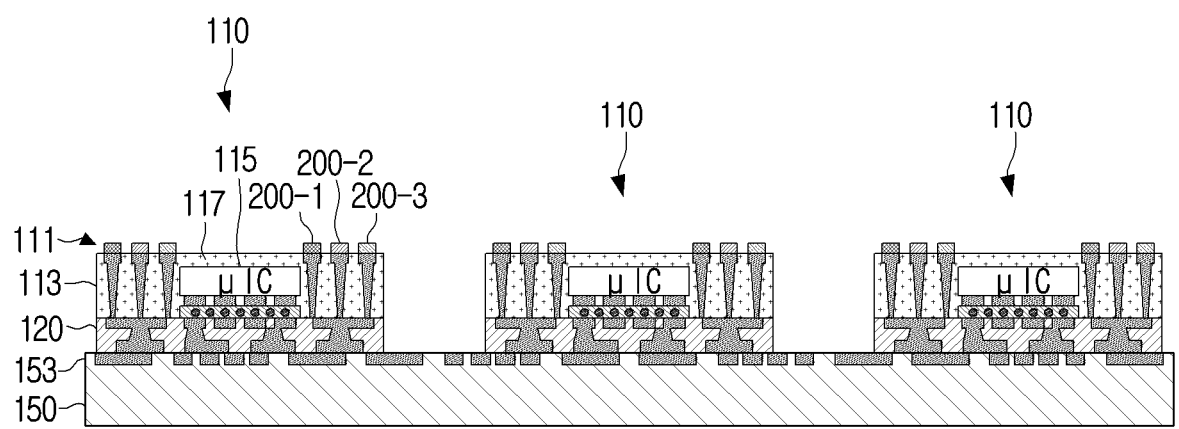
FIG. 4 is a cross-sectional view illustrating an arrangement of a plurality of pixel modules according to an embodiment of the disclosure.

FIG. 4 is a cross-sectional view illustrating an arrangement of a plurality of pixel modules 110 according to an embodiment of the disclosure.

Referring to FIG. 4, the display panel 103 of various embodiments may include a base substrate 150 and each of the plurality of pixel modules 110 may include a light emitting layer 111, a driver layer 113, and a substrate layer 120.

The base substrate 150 may be provided with a wiring layer 153 on one surface thereof such that the data line 230 (see FIG. 7) and/or the power lines 241 and 245 (see FIG. 7) may be patterned, and the plurality of pixel modules 110 may be mounted so as to be electrically connected in a matrix form over the wiring layer 153.

The base substrate 150 of various embodiments may include a wiring layer 153, the wiring layer 153 may be a single layer, and the data line 230 and the power lines 241 and 245 may be patterned on the wiring layer 153. The structural feature in which the wiring layer 153 may be formed as a single layer will be described in detail with reference to FIG. 7.

The wiring layer 153 of various embodiments may be formed through a photolithography process or through an inkjet technology, and may include a conductive material, for example, a conductor line made of copper. In this example, the wire line of the wiring layer 153 may be implemented as a data line 230 and/or power lines 241 and 245.

The wiring layer 153 may be patterned into a single layer, and the base substrate 150 may have a 1-layer structure. As the base substrate 150 has a 1-layer structure and the total thickness is reduced, the number of wiring layers may be reduced to ensure a production yield, and the manufacturing cost may be lowered and manufacturing efficiency may be increased.

The base substrate 150 of one embodiment may be formed of a material having flexibility and may include, for example, high polymer material such as polyimide resin. The base substrate 150 of various embodiments may be implemented as a flexible printed circuit board (FPCB) of which at least a portion has flexibility, and at least a portion of the display panel 103 may be folded or bent through the flexibility of the base substrate 150, and may be implemented as a flexible display or a foldable display. According to various embodiments, the base substrate 150 may include a thin film transistor (TFT) implemented in a circuit, and may include glass, a printed circuit board (PCB), or a silicon wafer.

Each of the plurality of pixel modules 110 may be arranged on one surface of the base substrate 150, that is, on the wiring layer 153 in a matrix form, and the wiring layer 153 and the substrate layer 120 may be electrically connected, and the wiring layer 153 may transmit a data signal to the DDI 115 through the substrate layer 120.

The plurality of pixel modules 110 according to various embodiments may include the substrate layer 120, the driver layer 113, and the light emitting layer 111.

The substrate layer 120 may be formed between the driving layer 113 and the base substrate 150, receive a data signal, and provide the same to the DDI 115. The substrate layer 120 according to various embodiments may include a first layer 121 formed with the data input pad 160 and the data output pad 170 and electrically connected with the base substrate 150 (see FIG. 9A), the second layer 125 (see FIG. 9A) provided in the opposite direction of the first layer 121, and an intermediate layer 123 (see FIG. 9A) including a plurality of via holes 124 passing through the first layer 121 and the second layer 125.

The intermediate layer 123 of the substrate layer 120 of various embodiments may be implemented using a polyimide resin such that a high density wiring and a plurality of via holes 124 are formed, and the substrate layer 120 may have a 2-layer structure in which the first layer 121 and the second layer 125 are deposited on both sides of the intermediate layer 123. Through this structure, the substrate layer 120 may implement an ultra-fine pixel pitch and may increase pixels per inch (PPI) value of the display panel 103.

The pixel pitch refers to the distance in the X-axis direction and the Y-axis direction between the pixels 10 forming the plurality of pixel modules 110, and the pixel pitch corresponds to a final pitch between each of the light-emitting devices 200 applied to the display panel 103, and thus may be referred to as a display pitch. The display pitch and pixel pitch may be the distance from one end of one pixel 10 to one side end of the nearest pixel 10 in the X-axis or Y-axis direction. The display pitch and pixel pitch may be the distance from the center of one pixel 10 to the center of the nearest pixel 10 in the X-axis or Y-axis direction.

The intermediate layer 123 of the disclosure may secure a high PPI by implementing an ultra-fine pixel pitch through a high-density wiring, and the display apparatus 100 may represent a fine and clear image. The display apparatus 100 of various embodiments may be implemented with the display apparatus 100 having a relatively small size, such as a cellular telephone, a tablet PC, a monitor, or a modular display.

The driver layer 113 may be formed between the substrate layer 120 and the light emitting layer 111 and may include the DDI 115 formed below the light emitting layer 111 to generate a driving signal for driving a plurality of light emitting devices 200 and a light blocking molding 117 (see FIG. 9C).

The DDI 115 may be electrically connected to the base substrate 150 through the second layer 125 of the substrate layer 120 to receive a digital data signal from the data line 230. The DDI 115 of the disclosure may convert a digital data signal into an analog signal and transmit the analog signal to the driving circuit 210 to control the plurality of light emitting devices 200, or the DDI 115 may transfer the digital data signal to the DDI 115 of the other pixel module 110 through the substrate layer 120, and this structure will be described in detail with reference to FIG. 5B.

The light blocking molding 117 may be formed as the light blocking member which blocks transmission of light is filled in the driver layer 113, and the light blocking molding 117 of one embodiment may be coated on the upper surface of the DDI 115 so as to prevent the DDI 115 from being exposed to the light emitting layer 111. The light blocking molding 117 may be implemented with a material having a color with low brightness such as achromatic color like black so as to block light.

The light blocking molding 117 may absorb light incident in the front direction of the display panel 103, improve the light efficiency of the display apparatus 100, and improve color reproducibility, and the light blocking molding 117 may prevent the light emitted through the light emitting device 200 from being leaked or reflected in the direction of the base substrate 150.

The light blocking molding 117 of various embodiments may be composed of a side molding made of a light blocking member and a light blocking film coated on an upper surface of the DDI 115, and at least a portion of the light blocking molding may include an opaque inorganic insulating material such as CrOx or MoOx, or an opaque organic insulating material such as a black resin.

The light emitting layer 111 may form at least one pixel 10 as a plurality of light emitting devices 200 are disposed. Each of the plurality of light emitting devices 200 may include R-LED devices 200-1, a plurality of G-LED devices 200-2, and a plurality of B-LED devices 200-3, and the plurality of light emitting devices 200 may be controlled by the DDI 115 and implement one pixel 10. Although not shown in the drawings, a side molding (not shown) for blocking light transmission may be formed between the light emitting devices 200 to block light transmission or light reflection to the adjacent light emitting device 200, and the contrast ratio of the display apparatus 100 may be improved.

Figure 5A:
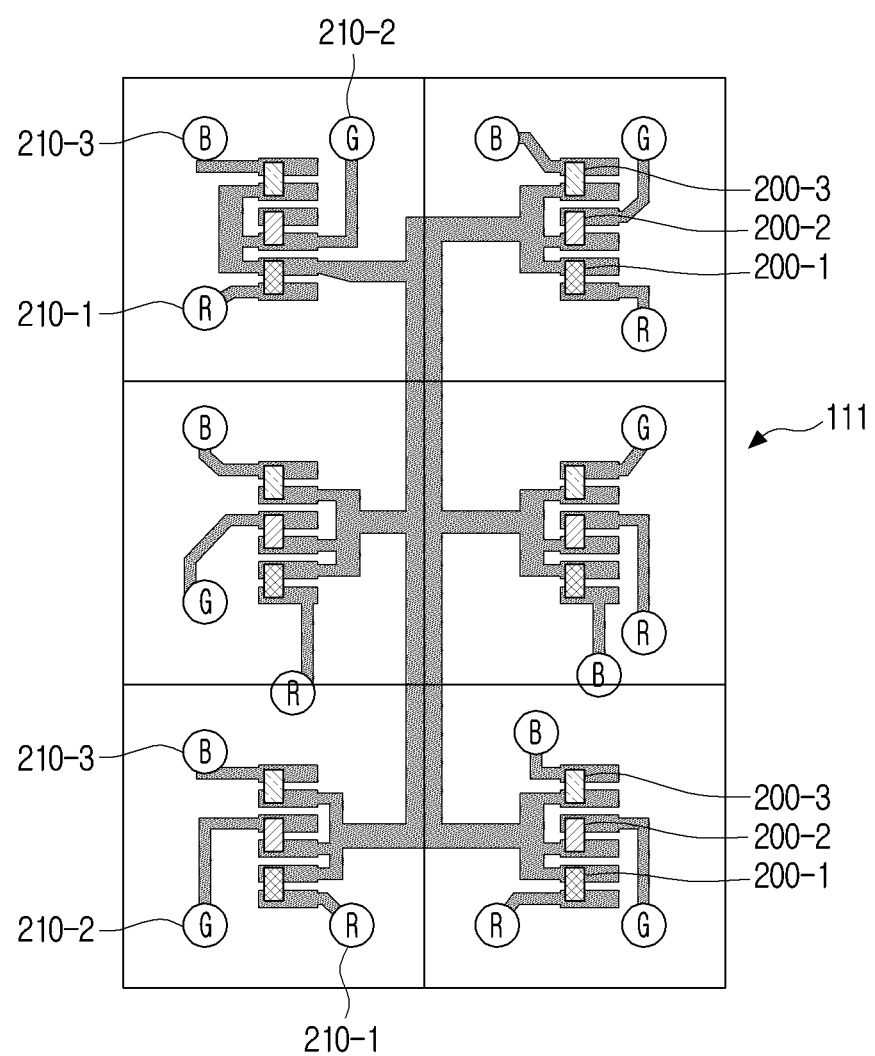
FIG. 5A is a plan view illustrating a light emitting layer according to an embodiment of the disclosure.
Figure 5B:
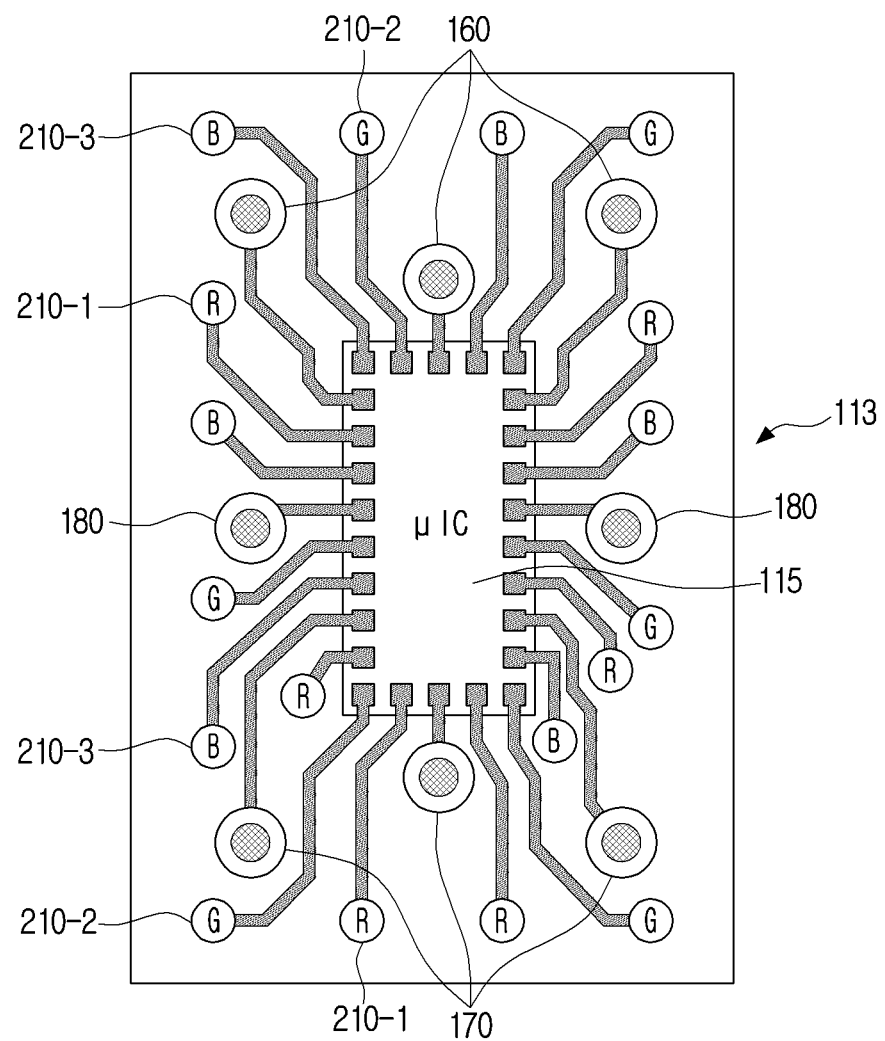
FIG. 5B is a plan view illustrating a driving layer according to an embodiment of the disclosure.
Figure 5C:
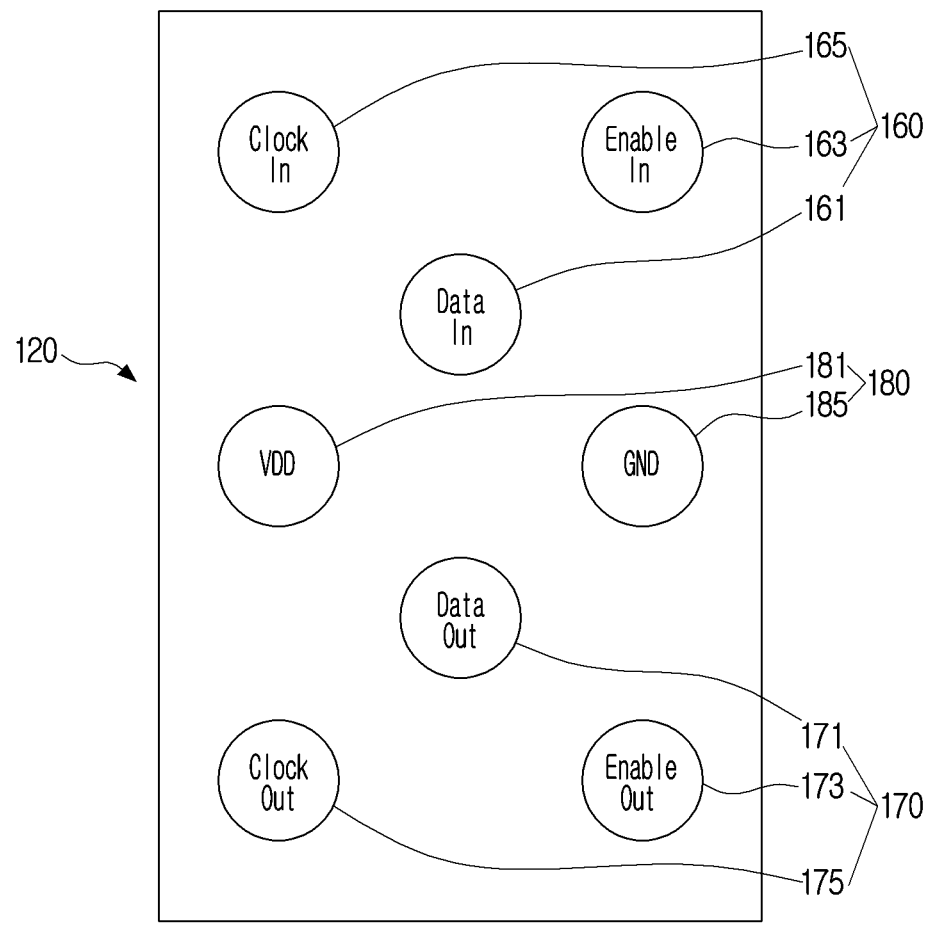
FIG. 5C is a rear view illustrating a substrate layer according to an embodiment of the disclosure.

FIG. 5A is a plan view illustrating the light emitting layer 111 according to an embodiment of the disclosure, FIG. 5B is a plan view illustrating the driving layer 113 according to an embodiment of the disclosure, and FIG. 5C is a rear view illustrating the substrate layer 120 according to an embodiment of the disclosure.

Referring to FIGS. 5A to 5C, the pixel module 110 of various embodiments may include a plurality of driving circuits, a data input pad 160, a data output pad 170, and a power input pad 180. Hereinafter, a process of transmitting and receiving signals through a plurality of input/output pads 160, 170, and 180 formed on the rear surface of the substrate layer 120 and controlling the plurality of light emitting devices 200 will be described with reference to the drawings.

The second layer 125 contacting the wiring layer 153 of the base substrate 150 and electrically connected may include a plurality of input/output pads 160, 170, 180.

The data input pad 160 may include a first input pad 161 to receive a data signal (Data In), a second input pad 163 to receive an enable signal (Enable In), and a third input pad 165 to receive a clock signal (Clock In). The data signal received through the data input pad 160 may be provided to the DDI 115 through a wiring structure formed in the substrate layer 120 and a plurality of via holes 124. The power input pad 180 may include a voltage pad 181 and a ground pad 185 that provide the DDI 115 and the driving voltage VDD and the ground voltage GND of the plurality of light emitting devices 200, respectively.

The DDI 115 may receive power through a wiring circuit of the substrate layer 120 and the driving layer 113 and may receive a digital data signal in a digital format. The DDI 115 may convert the digital data signal into an analog form, and control the driving timing and gray level of the plurality of light emitting devices 200-1, 200-2, and 200-3 through the plurality of driving circuits 210-1, 210-2, and 210-3 to implement the pixel 10.

The data output pad 170 may include a first output pad 171 transmitting a data signal (Data Out), a second output pad 173 transmitting an enable signal (Enable Out), and a third output pad 175 transmitting a clock signal (Clock Out). The data output pad 170 may receive a digital data signal from the DDI 115 through the wiring structure formed on the substrate layer 120 and the plurality of via holes 124, and may transmit the data signal to a different pixel module 110 again.

Figure 7:
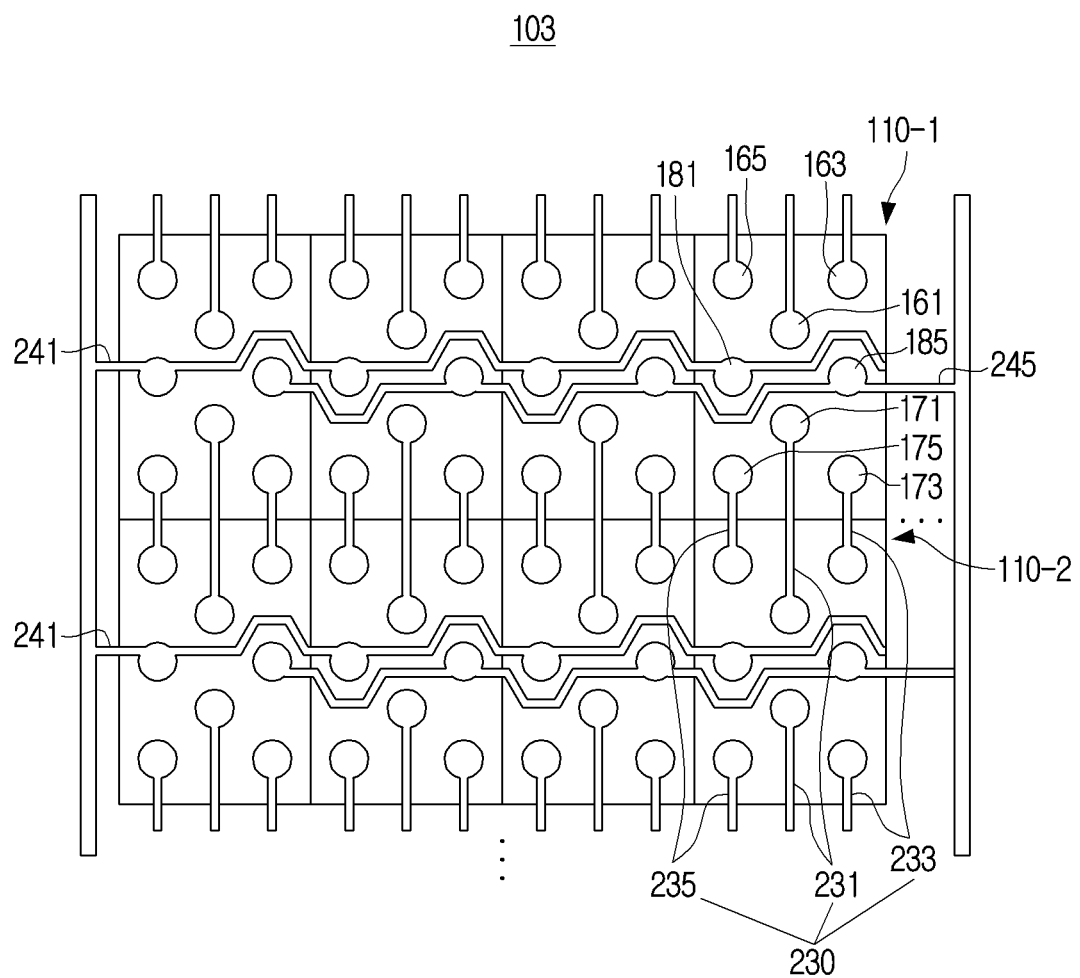
FIG. 7 is a rear view of a display apparatus according to an embodiment of the disclosure.

The pixel module 110 of one embodiment of the disclosure may not have a structure in that one data line 230 (see FIG. 7) is divided by not only receiving a data signal from the drive driver 131, but also receiving the digital data signal and transmitting the signal to the different pixel module 110 through the DDI 115, and may include a plurality of divided sub-data lines 239 (see FIG. 7). The wiring structure of the input/output pad and the data line 230 and the power lines 241 and 245 will be described in detail with reference to FIG. 7.

Referring to FIG. 5C, the substrate layer 120 of various embodiments may implement a driving circuit having a wiring structure integrated with a high density through a plurality of via holes 124 formed in the intermediate layer 123 and a wiring structure, and transmit and receive data signals from adjacent pixel modules 110 through at least eight input/output pads. The pixel module 110 of the disclosure may minimize the quantity of input/output pads to design a wiring structure of the data line 230 and the plurality of power lines 241 and 245 on one wiring layer 153, and may implement a base substrate 150 having a thin thickness as a 1-layer.

Figure 6:
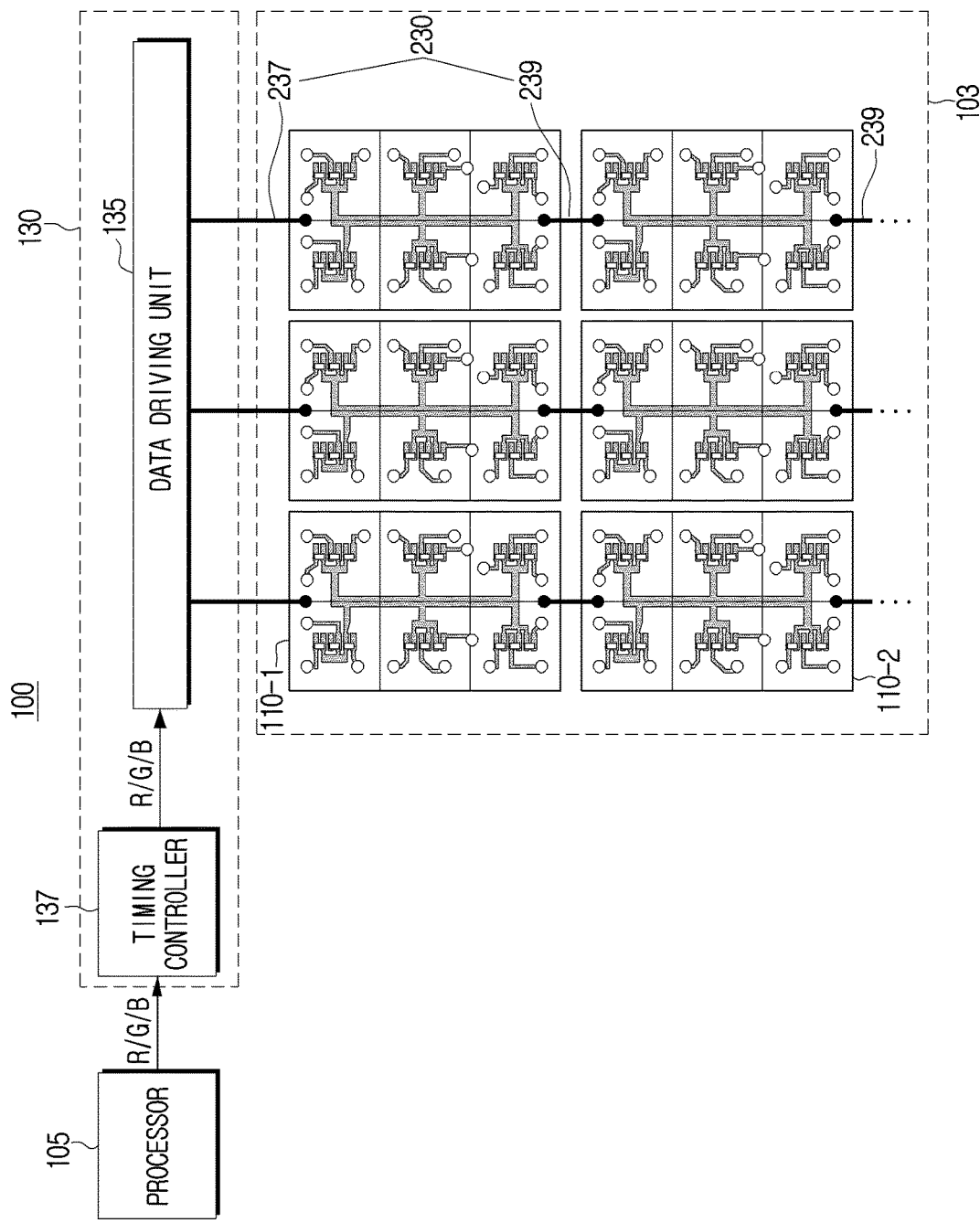
FIG. 6 is a block diagram of a display apparatus according to an embodiment of the disclosure.

FIG. 6 is a configuration diagram of the display apparatus according to an embodiment of the disclosure.

Referring to FIG. 6, the driving driver 131 of various embodiments may include the data driving unit 135 and the data line 230 may include a sub-data line 239.

In the display panel 103, a plurality of pixel modules 110 may be disposed in a matrix format and the plurality of power lines 241, 245 and a plurality of data lines 230 may be connected to the display panel 103 from the panel driver 130.

Each of the plurality of power lines 241 and 245 and the plurality of data lines 230 in various embodiments may be arranged in a matrix type in row direction and a column direction, and may be connected to the plurality of pixel modules 110. However, in describing the row direction and the column direction, the row direction and the column direction are not limited in the orthogonal direction on the same plane, and in various embodiments, the row direction and the column direction may refer to different directions, which are not orthogonal to each other and at least not parallel to each other.

The panel driver 130 may transmit the display panel 103 according to the control of the processor 105, and more specifically, transmit data signal to each of the plurality of DDI 115. According to various embodiments, the panel driver 130 may include a timing controller 137 and a driving driver 131.

The timing controller 137 may receive an input signal, a horizontal synchronization signal, a vertical synchronization signal, and/or a main clock signal from the processor 105 or the outside to generate an image data signal, a scan control signal, a data control signal, and/or a light emission control signal to transmit the signals to the DDI 115 via the data driving unit 135.

The driving driver 131 may include a data driving unit 135. The data driving unit 135 may provide a digital data signal through a data line 230 to each of the plurality of pixel modules 110 of the display panel 103. According to various embodiments, the data driving unit 135 may include a driver IC, and may generate and transmit a data signal according to a signal received from the timing controller 137. The data driving unit 135 of another embodiment may be implemented in a wiring structure including power lines 241 and 245 or a data line 230 without including a driver IC for generating a signal, and the DDI 115 may generate a data signal based on a signal of the timing controller 137.

The timing controller 137 may provide at least one of the Ref control signal, Sweep control signal, RES control signal, or MUX Sel R, G, B control signal to the DDI 115 in response to the structure of the plurality of pixel modules 110.

Although not shown in the drawings, the panel driver 130 of various embodiments may omit a controller or an IC structure and have a wiring structure, and the DDI 115 of each of the plurality of pixel modules 110 may generate at least one of the Ref control signal, the Sweep control signal, the RES control signal, and the MUX_Sel R, G, B control signal and provide the generated signal to the driving circuit 210. In this example, the structure of the panel driver 130 may be simplified.

The data driving unit 135 (or the source driver, the data driver) is a means for generating and/or transmitting a data signal and may generate a data signal (e.g., a specific voltage, an amplitude setting voltage, and a pulse width setting voltage) by receiving image data of the R, G, and B components from the processor 105, and may apply the image data to the display panel 103 through the data line 230.

The data line 230 may be connected to each DDI 115 in a column unit in a plurality of pixel modules 110 arranged in a matrix form. The data line 230 may be m numbers in a column unit in a matrix of m columns.

The data line 230 may include a main data line 237 and a sub data line 239. The main data line 237 may connect the data driving unit 135 and one pixel module 110-1 of the plurality of pixel modules 110 to transmit a data signal, and the sub data line 239 may transmit a data signal from one pixel module 110-1 of the plurality of pixel modules 110 to another adjacent pixel module 110-2.

According to an embodiment, the plurality of pixel modules 110 may include a first pixel module 110 adjacent to the data driving unit 135 and a second pixel module 110 adjacent to the first pixel module 110. In this example, the main data line 237 may transmit a data signal from the data driving unit 135 to the data input pad 160 of the first pixel module 110, and the sub data line 239 may transmit the data signal from the data output pad 170 of the first pixel module 110 to the data input pad 160 of the second pixel module 110.

The main data line 237 and the sub data line 239 in the data line may be plural, the main data line 237 may have a structure in which the main data line 237 is segmented from the sub data line 230, and at least a portion of the sub data lines 239 may be segmented. The data line 230 of one embodiment of the disclosure may have a structure to be segmented without being continuous, and the data signal may be transmitted to the data input pad 160 of the first pixel module 110 through the main data line 237, and the input data signal may be transmitted to the sub data line 239 through the DDI 115 and the data output pad 170 of the first pixel module 110, and the data signal may be continuously transmitted to the second pixel module 110 and the other pixel module 110.

The power lines 241 and 245 may be connected to each DDI 115 in a row unit in a plurality of pixel modules 110 arranged in a matrix form. Referring to FIG. 7, in a matrix in which a plurality of pixel modules 110 are composed of n rows, n rows may be present so as to be connected to each of the plurality of pixel modules 110, and the embodiment is not limited thereto, and a structure in which power is supplied to each of the plurality of pixel modules 110 may be satisfied.

The plurality of power lines 241 and 245 are lines to supply power to the DDI 115 of the plurality of pixel modules 110 included in the display panel 103, and the power lines 241 and 245 of one embodiment are continuously deployed in the row direction, and the power lines 241 and 245 are segmented to correspond to the plurality of pixel modules 110 and connected to the display panel 103.

The processor 105 may control the overall operation of the display apparatus 100 and may provide an image signal to the display panel 103. The processor 105 may control the panel driver 130 to control the DDI 115 included in each of the plurality of pixel modules 110 of the display panel 103, through which the processor 105 may set the pulse width of the driving current according to the pulse width setting voltage, and may set the amplitude of the driving current according to the amplitude setting voltage.

The processor 105 according to various embodiments may be implemented by one or more of a central processing unit (CPU), micro-controller, application processor (AP), communication processor (CP), or Advanced reduced instruction set (RISC) Machine (ARM) sensor.

When the display panel 103 is arranged in a matrix form consisting of n rows and m columns in units of the plurality of pixel modules 110, the processor 105 may provide a data signal to the DDI 115 arranged in column units through the data line 230, and the DDI 115 may set the amplitude or pulse width of the driving current to the plurality of driving circuits 210. The processor 105 may supply power to the DDI 115 arranged in a row unit through the power lines 241 and 245, and the DDI 115 may control the current source of the driving circuit 210 to apply the driving voltage VDD to the light emitting device 200, or control the linear change voltage Sweep voltage to enable the display panel 103 to display an image.

Although the processor 105 and the timing controller 137 are described as separate components in the above example, the timing controller 137 may perform the function of the processor 105 without the processor 105, and in various embodiments, the DDI 115 may perform the functions of the processor 105 and the timing controller 137.

Although the light-emitting device 200 has been described as a micro LED or LED device, but the embodiment is not limited thereto, and the display panel 103 may be a chip on glass (COG) type, but a structure according to various embodiments of the disclosure may be applied to a chip on board (COB) type display panel according to an embodiment.

According to an embodiment, the display panel 103 may be implemented with an independent display panel 103 without scalability, or may be implemented with a scalable display module that configures a portion of a large area tiled display.

FIG. 7 is a rear view of the display apparatus 100 according to an embodiment of the disclosure.

Referring to FIG. 7, the data line 230 of various embodiments may include a first data line 231, a second data line 233, and a third data line 235, and the power lines 241 and 245 may include a voltage line 241 and a ground line 245.

According to various embodiments, the data line 230, specifically the main data line 237 or the sub data line 239, may include first to third data lines 231, 233 and 235 depending on the type of data signal transmitted.

The first data line 231 may be connected to the first input pad 161 of the plurality of pixel modules 110 to transmit a data signal (Data In). According to various embodiments, the first data line 231 may connect the data driver and the first input pad 161 of the first pixel module 110-1, or may connect the first output pad 171 of the first pixel module 110-1 and the first input pad 161 of the second pixel module 110-2 to transmit a data signal (Data In) to the adjacent pixel module 110.

The second data line 233 may be connected to the second input pad 163 of the plurality of pixel modules 110 to transmit an enable signal (Enable In). According to various embodiments, the second data line 233 may connect the data driver and the second input pad 163 of the first pixel module 110-1, or may connect the second output pad 173 of the first pixel module 110-1 and the second input pad 163 of the second pixel module 110-2 to transmit an enable signal (Enable In) to the adjacent pixel module 110.

The third data line 235 may transmit a clock signal (Clock In) to the third input pad 165 of the plurality of pixel modules 110. According to various embodiments, the third data line 235 may connect the data driving unit 135 and the third input pad 165 of the first pixel module 110-1, or may connect the third output pad 175 of the first pixel module 110-1 and the third input pad 165 of the second pixel module 110-2 to transmit a clock signal (Clock In) to the adjacent pixel module 110.

Although the power lines 241 and 245 and the data line 230 are coupled to the plurality of pixel modules 110 in FIG. 7, the power lines 241 and 245 and the data line 230 may be patterned on the wiring layer 153 of the base substrate 150, and the plurality of pixel modules 110 may be coupled on the wiring layer 153.

According to various embodiments, the main data line 237 and/or a plurality of sub data lines 239 may be segmented from each other, spaced apart from each other and disposed on the base substrate 150, and may connect a plurality of pixels 10. For example, the plurality of first data lines 231 may be segmented from each other and spaced apart from each other, and the plurality of second data lines 233 may be segmented and spaced apart from each other, and the plurality of third data lines 235 may be segmented and spaced apart from each other.

The power lines 241 and 245 may include a voltage line 241 and a ground line 245, and a voltage line 241 and a ground line 245 may be disposed in a segmented region between the plurality of sub data lines 239. As described above, the power lines 241 and 245 may be deployed in a row direction and may be segmented into a plurality of pixel modules 110 in a row direction.

The power lines 241 and 245 and the data line 230 according to various embodiments may be provided in a single layered wiring layer 153 formed on one surface of the base substrate 150. More specifically, in the wiring layer 153, the plurality of sub data lines 239 are segmented from each other and spaced apart in the column direction of the matrix type, and the power lines 241 and 245 may be arranged in the row direction of the matrix type.

The base substrate 150 of the disclosure may be disposed between the space where the plurality of sub-data lines 239 of the power lines 241, 245 are spaced apart from each other, so that the data line 230 and the power lines 241 and 245 may be connected to a plurality of pixel modules 110 without crossing with each other. As a result, the data line 230 and the power lines 241 and 245 of one embodiment of the disclosure may be formed by being patterned in the wiring layer 153 formed of a single layer, thereby reducing the total thickness of the base substrate 150, reducing the number of wiring layers, securing manufacturing yield by improving manufacturing difficulty, reducing manufacturing costs, and increasing manufacturing efficiency.

Figure 8:
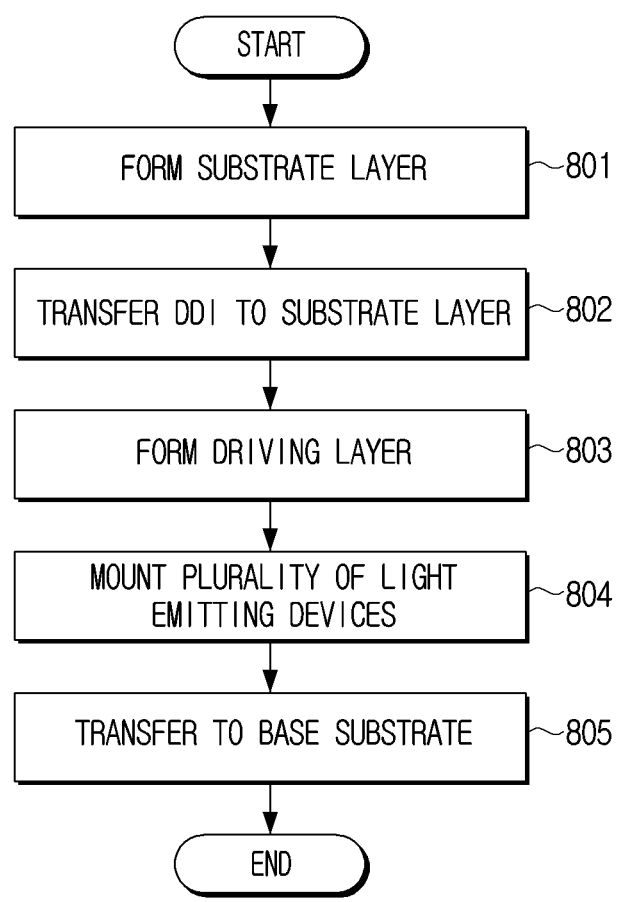
FIG. 8 is a flowchart of a method of manufacturing a display apparatus according to an embodiment of the disclosure.

FIG. 8 is a flowchart of a method of manufacturing the display apparatus 100 according to an embodiment of the disclosure, and FIGS. 9A to 9D are cross-sectional views illustrating a method of manufacturing the display apparatus 100 according to various embodiments of the disclosure.

Hereinafter, a method of manufacturing the display apparatus 100 will be described with reference to FIGS. 8, and 9A to 9D, and the same reference numerals are used for the same components as those described above, and repeated descriptions of the same components will be omitted.

The substrate layer 120 may be formed to include a data input pad 160 that receives a data signal and a data output pad 170 that provides a data signal at operation 801 (see FIG. 8).

Figure 9A:
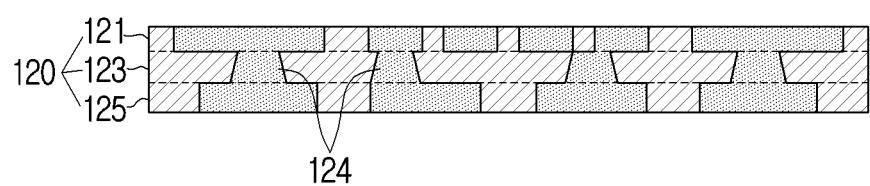
FIG. 9A is a cross-sectional view illustrating a method of manufacturing a display apparatus according to an embodiment of the disclosure.
Figure 9B:
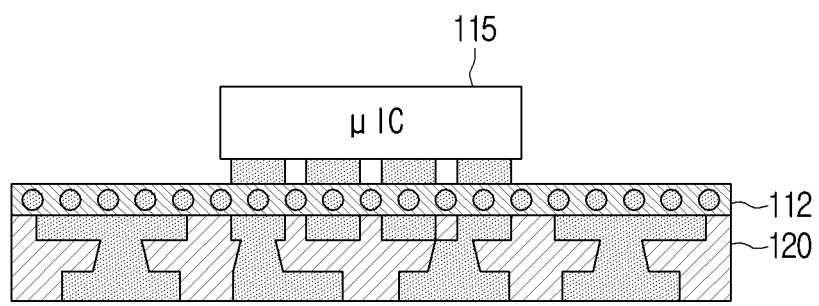
FIG. 9B is a cross-sectional view illustrating a method of manufacturing a display apparatus according to an embodiment of the disclosure.

Referring to FIG. 9A, the substrate layer 120 may include a first layer 121, an intermediate layer 123, and a second layer 125, and the first layer 121 and the second layer 125 may be deposited and patterned on the intermediate layer 123 to form a wiring structure. The substrate layer 120 may be electrically connected in a vertical direction by forming a plurality of via holes 124 through the first layer 121 and the second layer 125, and a two-layer double-sided substrate layer 120 may be formed through the process.

The first layer 121 and the second layer 125 of various embodiments may have a structure in which a semiconductor layer made of metal such as tin (Sn), indium (In), and gallium (Ga) is coated on a conductor layer made of a conductor such as copper (Cu), titanium (Ti), tungsten (W), platinum (Pt), and magnesium (Mg), and the intermediate layer 123 may be made of a material including a polymer resin such as polyimide.

The thickness of the substrate layer 120 in various embodiments may be between 45 μm and 55 μm, for example, the intermediate layer 123 may be formed to a thickness of about 35 μm, and each of the first layer 121 and the second layer 125 may be formed to a thickness of 8 μm to 9 μm.

The DDI 115 may be transferred to the upper surface of the substrate layer 120 at operation 802 (see FIG. 8). Referring to FIG. 9A, after forming the bonding layer 112 in which the DDI 115 is wired and bonded to the upper surface of the substrate layer 120, the DDI 115 may be transferred onto the bonding layer 112.

Referring to the structure of the driving layer 113 of FIG. 5B, the DDI 115 may be electrically connected to a plurality of input/output pads 160, 170, and 180 of the substrate layer 120 through a wiring structure, and may be connected to a driving circuit of the plurality of light emitting devices 200 to control the plurality of light emitting devices 200.

By coating the light blocking molding 117 on the upper surface of the substrate layer 120 and the upper surface of the DDI 115 and wiring so that a plurality of LED devices may be bonded, the driving layer 113 may be formed at operation 803 (see FIG. 8).

Figure 9C:
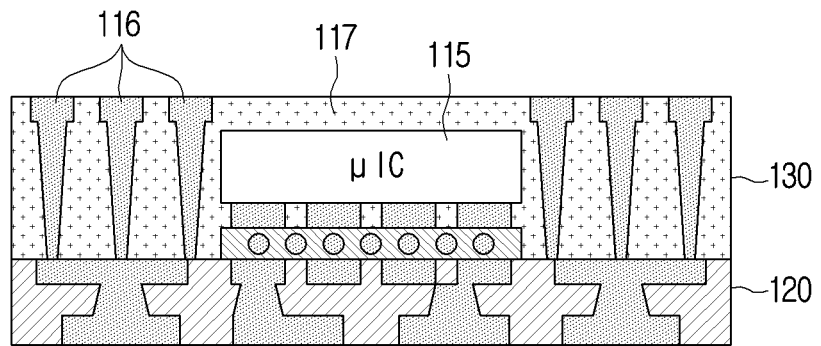
FIG. 9C is a cross-sectional view illustrating a method of manufacturing a display apparatus according to an embodiment of the disclosure.

Referring to FIG. 9C, after a portion of the bonding layer 112 deposited in operation 802 of the DDI 115 is removed, a light blocking molding 117 may be coated on an upper surface of the substrate layer 120 and an upper surface of the DDI 115. The light blocking molding 117 of various embodiments may include a process in which a film-shaped light blocking member is coated, and a bonding wire 116 of the plurality of light emitting devices 200 may be formed between the light blocking molding 117. The bonding wires 116 of various embodiments may be part of a driving circuit for driving the light emitting device 200, or may be electrically connected to the first layer 121 of the substrate layer 120, or may be connected to the DDI 115.

By covering the upper surface of the DDI 115, the light blocking member absorbs light so as not to be reflected from the upper surface of the DDI 115 incident in the front direction of the display panel 103, and may improve light efficiency of the display apparatus 100 and improve color reproducibility. The thickness of the driving layer 113 of various embodiments may be about 90 μm, but is not limited thereto.

Figure 9D:
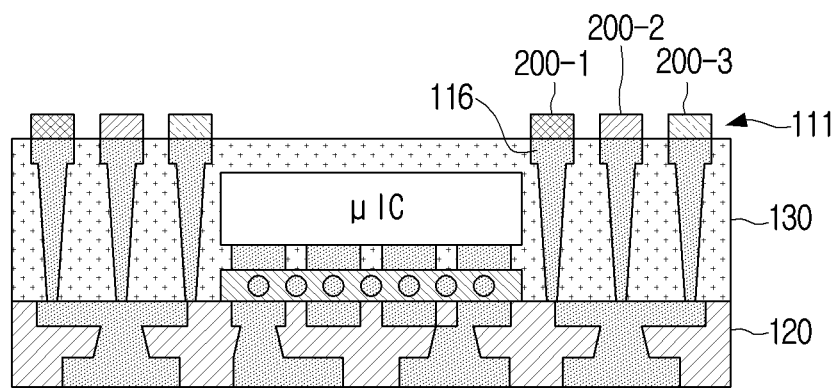
FIG. 9D is a cross-sectional view illustrating a method of manufacturing a display apparatus according to an embodiment of the disclosure.

A plurality of light emitting devices 200 may be mounted on the driving layer 113 to form a light emitting layer 111 at operation 804 (see FIG. 8). Referring to FIG. 9D, the plurality of light emitting devices 200 may be transferred to be bonded on the bonding wires 116 provided in the driving layer 113 forming step at operation 803. Although not shown, a side molding (not shown) may be formed between the plurality of light emitting devices 200 to form a light emitting layer 111.

The plurality of pixel modules 110 formed of the substrate layer 120, the driving layer 113, and the light emitting layer 111 may be transferred to the base substrate 150 in a matrix form at operation 805 (see FIG. 8). Referring to FIG. 4, the plurality of pixel modules 110 may be disposed on the wiring layer 153 of the base substrate 150.

The base substrate 150 may be formed before the transferring on the substrate 150 at operation 805. According to an embodiment, the base substrate 150 may separately arrange the segmented plurality of sub-data lines 230 in a row direction of a matrix format, and may arrange the power lines 241 and 245 in a column direction of a matrix type, and preferably, the power lines 241, 245 may be disposed between the space where the plurality of sub-data lines 239 so that the wiring layer 153 may be implemented as a single layer. The plurality of pixel modules 110 may be transferred in a matrix form on the base substrate 150 such that the plurality of input/output pads 160, 170 and 180 provided in the substrate layer 120 and the power lines 241 and 245 formed in the wiring layer 153 and the data line 230 are electrically connected.

Hereinafter, a pixel module 1110 according to another embodiment of the disclosure will be described with reference to the drawings. The pixel module 1110 according to another embodiment of the disclosure is similar to the pixel module 110 described above. Accordingly, in the description of the pixel module 1110 according to another embodiment of the disclosure, a description will be omitted for the same configuration as the pixel module 110 described above and different configurations will be described.

Figure 10:
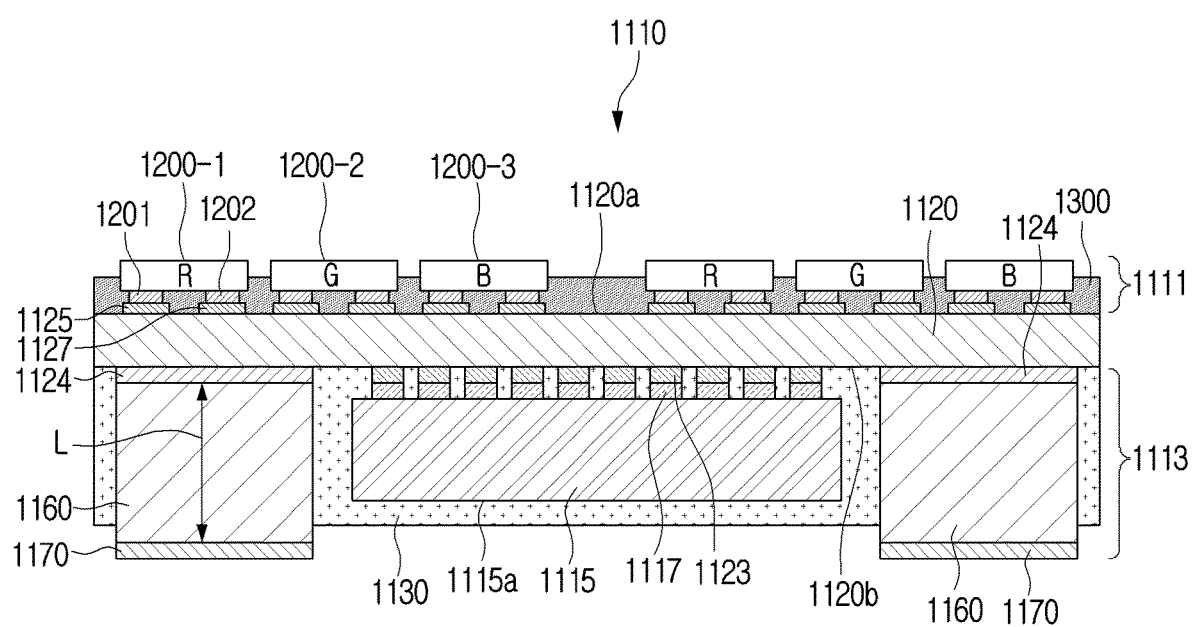
FIG. 10 is a cross-sectional view illustrating a pixel module of a display apparatus according to an embodiment of the disclosure.

FIG. 10 is a cross-sectional view illustrating a pixel module of the display apparatus according to an embodiment of the disclosure.

Referring to FIG. 10, the pixel module 1110 may include a substrate layer 1120, a driving layer 1113, and a light emitting layer 1111.

The substrate layer 1120 may be formed as a single layer, but is not limited thereto and a plurality of layers may be formed in a laminated format similar to the substrate layer 120 described above.

The substrate layer 1120 may include a light emitting layer 1111 disposed on a first surface 1120a. The first surface 1120a of the substrate layer 1120 may be arranged with a plurality of electrode pads 1125 and 1127 electrically connected to the electrodes 1201 and 1202 of the plurality of light emitting devices 1200-1, 1200-2 and 1200-3, respectively.

A black matrix 1300 may be formed between the plurality of light emitting devices 1200-1, 1200-2, and 1200-3 on the first surface 1120a of the substrate layer 1112. The black matrix 1300 may prevent light emitted from the plurality of light-emitting devices 1200-1, 1200-2, and 1200-3 from transmitting or reflecting adjacent light-emitting elements, thereby improving the contrast ratio of the display apparatus 1100 (see FIG. 13). The black matrix 1300 may absorb light incident in the front direction of the display panel 103 (see FIG. 13), thereby improving the light efficiency of the display apparatus and improving color reproducibility. The black matrix 1300 may be replaced with the light blocking molding 117 described above.

Referring to FIG. 10, the black matrix 1300 is shown to have a thickness that may cover to a part of a side surface of each of the light-emitting elements 1200-1, 1200-2, and 1200-3, but the embodiment is not limited thereto. For example, the black matrix 1300 may have the thickness that may cover the entire side of each light emitting device without covering the light emitting surface of each of the light emitting devices 1200-1, 1200-2 and 1200-3. The light emitting surface of the light emitting device may refer to the opposite surface of the surface on which the electrodes 1201 and 1202 of the light emitting device are disposed. In addition, the side surface of the light emitting device is not referred to as a light emitting surface but light may be emitted.

The driving layer 113 may be disposed on the second surface 1120b of the substrate layer 1120 located on the opposite side of the first surface 1120a of the substrate layer 1120. The second surface 1120b of the substrate layer 1120 may include a plurality of terminal pads 1123 electrically connected to a plurality of terminals 1117 of the DDI 1115, and a plurality of connection pads 1124 electrically connected to the plurality of wiring members 1160.

The plurality of connection pads 1124 may include the data input pad 160, the data output pad 170, and the power input pad 180. The plurality of connection pads 1124 may be electrically connected to the plurality of terminal pads 1123 or the plurality of electrode pads 1125 or 1127.

The substrate layer 1120 may be a glass substrate, a synthetic resin substrate having hardness, a synthetic substrate having flexibility, or a ceramic substrate. In this disclosure, the substrate of the synthetic resin may be, for example, a substrate including materials such as Polyimide (PI), Polyethylene Terephthalate (PET), Polyethersulfone (PES), Polyethylene Naphthalate (PEN), Polycarbonate (PC), or the like.

The light-emitting layer 1111 may include a plurality of light-emitting elements 1200-1, 1200-2, and 1200-3 to form at least one pixel 10. The plurality of light-emitting devices 1200-1, 1200-2, and 1200-3 may include an R-LED light-emitting element 1200-1, a G-LED light-emitting element 1200-2, and a B-LED light-emitting element 1200-3, and the plurality of light-emitting elements 1200-1, 1200-2, and 1200-3 may be controlled by the DDI 1115 to implement one pixel. The plurality of light emitting devices 1200-1, 1200-2, and 1200-3 may be arranged at a constant pixel pitch in the X-axis direction and the Y-axis direction.

The driving layer 1113 may be formed on another surface of the substrate layer 1120. Accordingly, the substrate layer 1120 may be disposed between the light emitting layer 1111 and the driving layer 1113.

The driving layer 1113 may include the DDI 1115, a plurality of wiring members 1160, and a molding 1130 covering the DDI 1115 and surrounding the plurality of wiring members 1160.

The DDI 1115 may be electrically coupled to a plurality of terminals 1117 that are arranged on a second side 1120b of the substrate layer 1120. The DDI 1115 may be electrically connected to the base substrate 1150 through the plurality of wiring members 1160 to receive a digital data signal from the data line 230 (see FIG. 7).

The plurality of wiring members 1160 may be electrically connected to the plurality of connection pads 1124 arranged on a second surface 1120b of the substrate layer 1120 before the molding 1130 is formed on the second surface 1120b of the substrate layer 1120.

The plurality of wiring members 1160 may be made of a conductive material. For example, each wiring member 1160 may be copper (Cu), aluminum (Al), tin (Sn), or iron (Fe), or an alloy including one of them.

The plurality of wiring members 1160 may have a predetermined shape so that the plurality of wiring members 1160 may be mounted on the substrate layer 1120 in a pick and place manner, such as the DDI 1115. For example, each wiring member 1160 may have a pillar shape having a predetermined length. In this example, the cross-section of the wiring member 1160 (e.g., a cross-section approximately parallel to the substrate layer 1120 in FIG. 10) may be of various shapes, such as circular, oval, or polygonal (e.g., triangular, square, etc.).

The pillar-shaped wiring member 1160 may have a length L that corresponds to or longer than the upper surface 1115a of the DDI 1115 from the second surface 1120b of the substrate layer 1120. Alternatively, the length L of the plurality of wiring members 1160 may be a length such that when the pixel module 1110 is mounted on the base substrate 1150, the length L of the plurality of wiring members 1160 may be stably connected to the wiring 1151 (see FIG. 13) of the base substrate 1150 without being interfered by the DDI 1115. The plurality of wiring members 1160 may be surface-treated to form the connection layer 1170 at an end that is bonded to the wiring 1151 of the base substrate 1150 for reliable connection with the wiring 1151 of the base substrate 1150.

The connection layer 1170 may be made of an alloy including a low melting point metal (e.g., tin (Sn), silver (Ag), indium (In), aluminum (Al), or zinc (Zn)) or an alloy including low melting point metal that enables smooth bonded between the wiring member 1160 and the wiring 1151 of the base substrate 1150.

The molding 1130 may be cured after being applied in a liquid form to the second surface 1120b of the substrate layer 1120. For example, the molding 1130 may be formed of a resin (epoxy resin or acrylic resin) having insulating properties, and may include a filler for strength reinforcement. The filler may be made of a material having high strength and insulating properties, for example, ceramic.

According to another embodiment of the disclosure, the plurality of wiring members 1160 may be mounted on the substrate layer 1120, and then the molding 1130 may be formed. Accordingly, it is possible to omit a drilling process for forming a via in the molding 1130 and a plating process for forming a wiring in the via, and thus, manufacturing costs may be saved. The reliability of the product may be improved by reducing the process error generated when the via is formed.

Hereinbelow, a method of manufacturing the display panel 103 according to another embodiment will be described with reference to the drawings.

Figure 11:
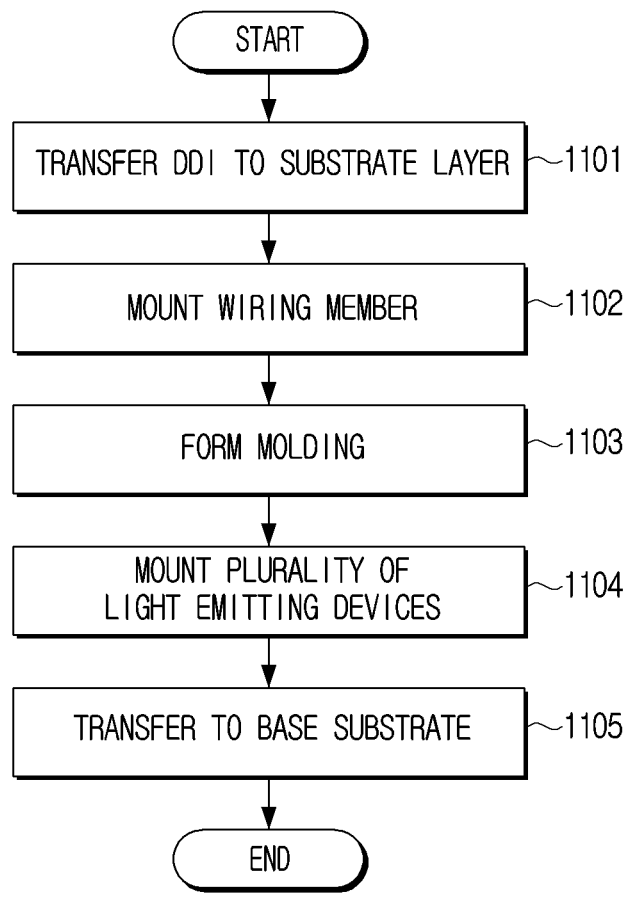
FIG. 11 is a flowchart of a method of manufacturing a display apparatus according to an embodiment of the disclosure.

FIG. 11 is a flowchart of a method of manufacturing the display apparatus 100 according to an embodiment of the disclosure, and FIGS. 12A to 12F and 13 are cross-sectional views illustrating steps of manufacturing the display apparatus according to various embodiments of the disclosure.

Figure 12A:
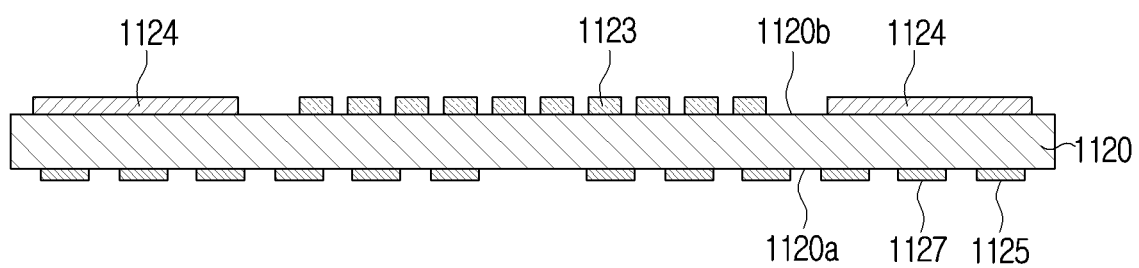
FIG. 12A is a cross-sectional view illustrating a method of manufacturing a display apparatus according to an embodiment of the disclosure.

Referring to FIG. 12A, the substrate layer 1120 may be disposed on the die layer 1120 so that the second surface 1120b faces upward.

Figure 12B:
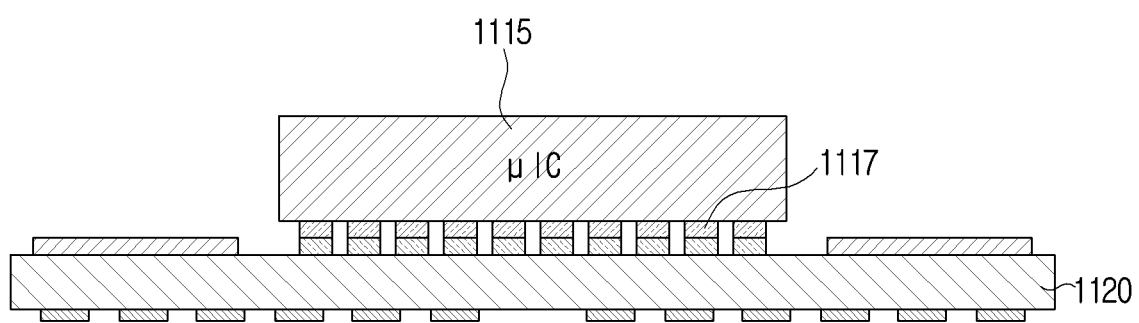
FIG. 12B is a cross-sectional view illustrating a method of manufacturing a display apparatus according to an embodiment of the disclosure.

Referring to FIG. 12B, the DDI 115 is transferred on the second substrate 1120b of the substrate layer 1120 at operation 1101 (see FIG. 11).

The DDI 1115 may be transferred to the second surface 1120b of the substrate layer 1120 and then processed through a thermal compression scheme. Accordingly, the plurality of terminals 1117 of the DDI 115 may be electrically and physically bonded to the plurality of terminal pads 1123 arranged. In this example, for smooth coupling between the plurality of terminals 1117 of the DDI 1115 and the plurality of terminal pads 1123, an adhesive layer including flux may be applied to the second surface 1120b of the substrate layer 1120 before transferring the DDI 1115 to the second surface 1120b of the substrate layer 1120.

Figure 12C:
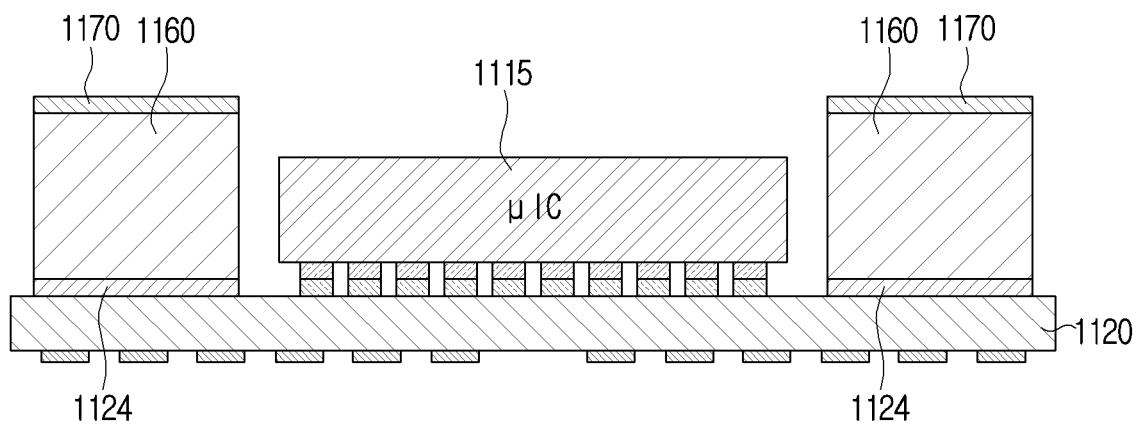
FIG. 12C is a cross-sectional view illustrating a method of manufacturing a display apparatus according to an embodiment of the disclosure.

Referring to FIG. 12C, a plurality of wiring members 1160 are mounted on the second surface 1120b of the substrate layer 1120 at operation 1102 (see FIG. 11).

In this example, the plurality of wiring members 1160 may be electrically connected to the plurality of connection pads 1124 arranged on the second surface 1120b of the substrate layer 1120, respectively. A connection layer may be formed on the plurality of connection pads 1124 before the plurality of connection pads 1124 are mounted on the second surface 1120b of the substrate layer 1120 so that the plurality of wiring members 1160 and the plurality of connection pads 1124 may be smoothly coupled. The connection layer formed on the plurality of connection pads 1124 may be formed of substantially the same material as the connection layer 1170 formed at the end of the wiring member 1160.

Figure 12D:
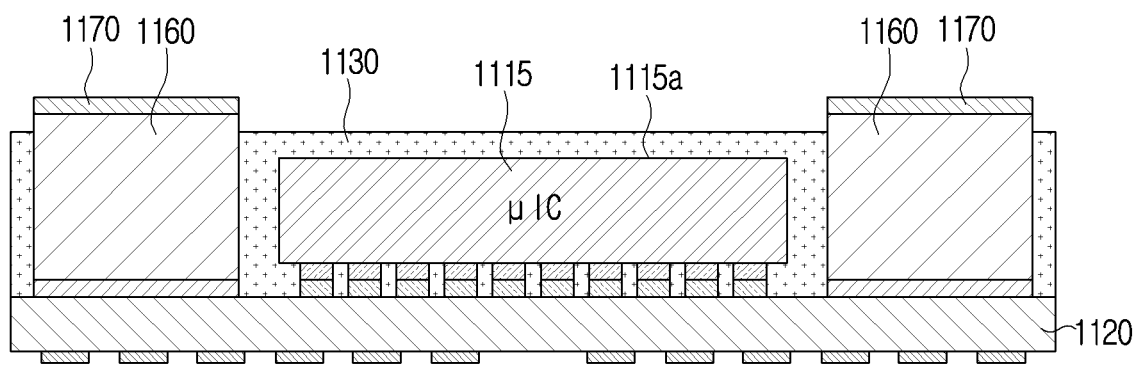
FIG. 12D is a cross-sectional view illustrating a method of manufacturing a display apparatus according to an embodiment of the disclosure.

Referring to FIG. 12D, the molding 1130 is formed on the second surface 1120b of the substrate layer 1120 at operation 1103 (see FIG. 11).

The molding 1130 may cover up to the upper surface 1115a of the DDI 1115 and may be applied to the second surface 1120b of the substrate layer 1120 to a thickness such that the end of the wiring member 1160 may be exposed. The embodiment is not limited thereto, and the molding 1130 may be applied to the second surface 1120b of the substrate layer 1120 to a thickness such that the upper surface 1115a of the DDI 1115 may be exposed.

The molding 1130 may be coated on the second surface 1120b of the substrate layer 1120 and then may be cured for a preset time. The cured molding 1130 may have improved strength by a filter included inside.

As described above, in another embodiment of the disclosure, after mounting the wiring member 1160, the molding 1130 may be formed, so that a drilling process for forming a via in the molding 1130 and a plating process for forming a wiring in the via may be omitted.

Figure 12E:
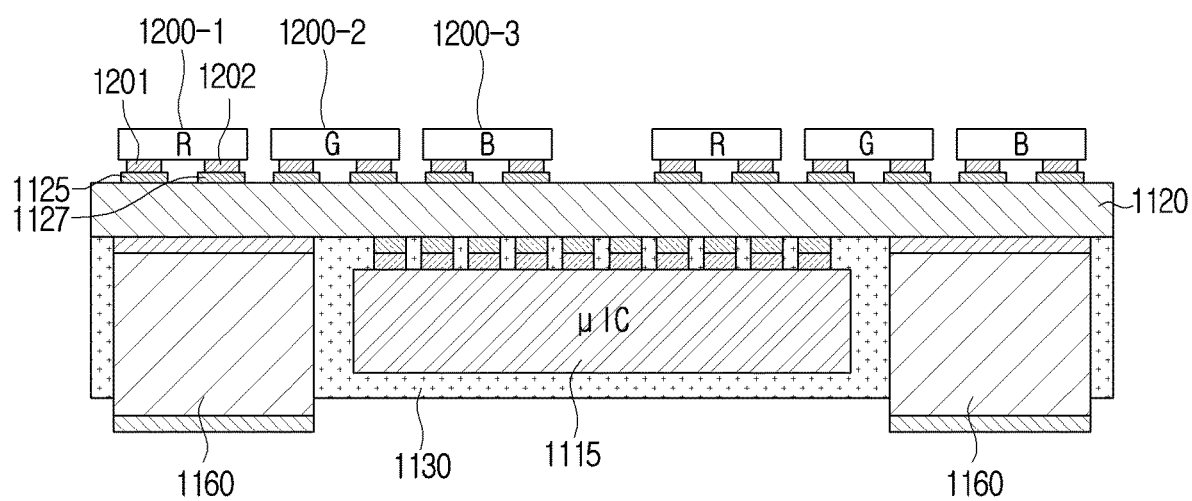
FIG. 12E is a cross-sectional view illustrating a method of manufacturing a display apparatus according to an embodiment of the disclosure.

Referring to FIG. 12E, the first surface 1120a of the substrate layer 1120 may be disposed to face upward, and a plurality of light emitting devices 1200-1, 1200-2, 1200-3 are mounted on the first surface 1120a of the substrate layer 1120 at operation 1104 (see FIG. 11).

In this example, the electrodes 1201 and 1202 of the plurality of light emitting devices 1200-1, 1200-2, and 1200-3 may be electrically connected to the plurality of electrode pads 1125 and 1127 provided on the first surface 1120a of the substrate layer 1120, respectively.

The anisotropic conductive film or the non-conductive film may be laminated on the first surface 1120a of the substrate layer 1120 before the plurality of light emitting devices 1200-1, 1200-2, 1200-3 are mounted on the first surface 1120a of the substrate layer 1120 so that the electrodes 1201 and 1202 of the plurality of light emitting devices 1200-1, 1200-2, 1200-3 and the plurality of electrode pads 1125 and 1127 may be smoothly coupled.

Figure 12F:
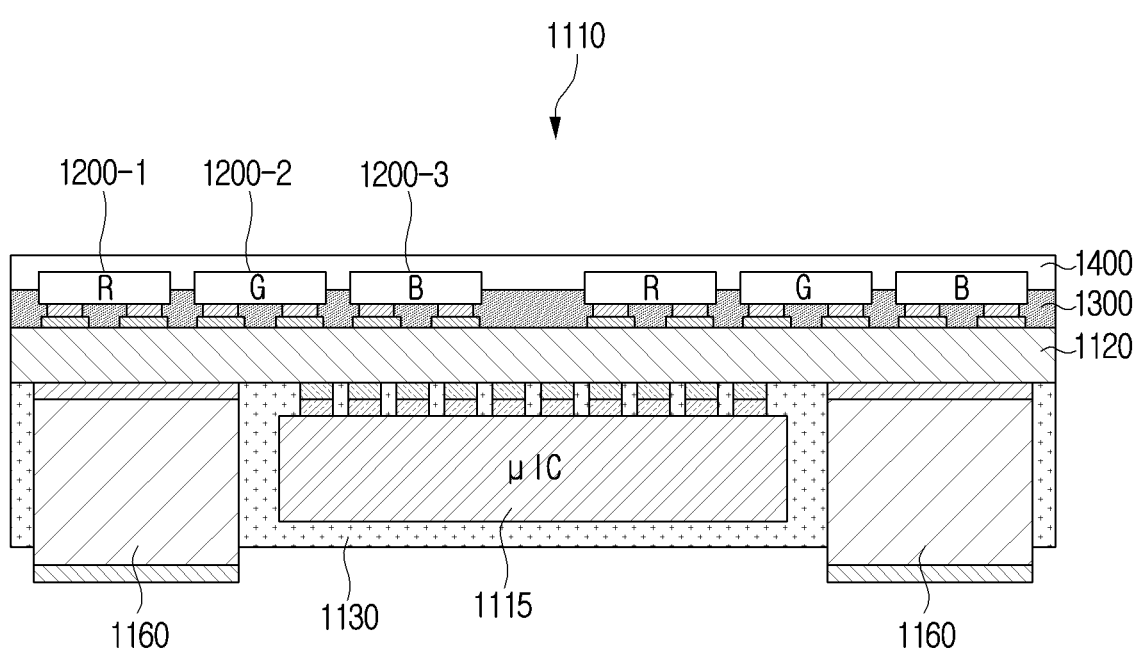
FIG. 12F is a cross-sectional view illustrating a method of manufacturing a display apparatus according to an embodiment of the disclosure.

Referring to FIG. 12F, a black matrix 1300 may be formed on the first surface 1120a of the substrate layer 1120. The black matrix 1300 may be formed between the plurality of light emitting devices 1200-1, 1200-2, and 1200-3 and may be formed to cover a portion of the plurality of light-emitting elements 1200-1, 1200-2, and 1200-3. After forming the black matrix 1300, a protective layer 1400 for protecting the plurality of light emitting devices 1200-1, 1200-2 and 1200-3 may be formed on the first surface 1120a of the substrate layer 1120. The protective layer 1400 may be formed of a material that does not affect the transmittance, reflectivity, and refractive index of light emitted from the plurality of light emitting devices 1200-1, 1200-2 and 1200-3. In addition, the protective layer 1400 may be an optical film capable of minimizing wasted light and improving luminance by directing the direction of the light toward the front surface through refraction and reflection.

The plurality of pixel modules 1110 formed through the above-described process may be arranged on a relay substrate before being transferred to the base substrate 1150, and may receive an inspection (for example, an electric luminescence (EL) test) for the plurality of light-emitting devices 1200-1, 1200-2, and 1200-3.

Referring to FIG. 13, a plurality of pixel modules 1110 may be transferred to one surface of the base substrate 1150 at operation 1105 (see FIG. 11).

The plurality of pixel modules 1110 may be transferred to one surface of the base substrate 1150 and may be bonded by a thermal compression method. In this example, each of the plurality of pixel modules 1110 may be smoothly connected to the wiring 1151 of the base substrate 1150 through the connection layer 1170.

Figure 14:
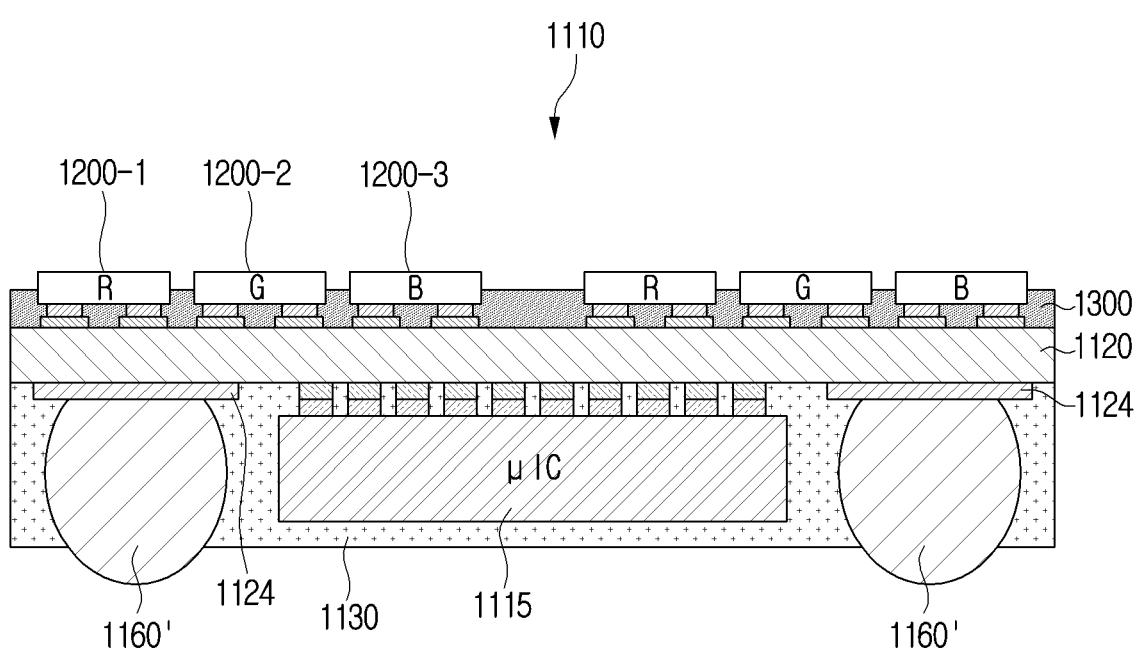
FIG. 14 illustrates an example of a pixel module including a ball-shaped wiring member according to an embodiment of the disclosure.

FIG. 14 illustrates an example of a pixel module including a ball-shaped wiring member according to an embodiment of the disclosure.

Although a pixel module 1110 shown in FIG. 10 has the shape in which a wiring member 1160 has a pillar shape, the shape of the pixel module 1110 is not limited thereto. For example, as shown in FIG. 14, the wiring member 1160' may be formed in a ball shape. In this example, the wiring member 1160' may be circular or oval in cross-section (e.g., a cross-section approximately perpendicular to the substrate layer 1120 in FIG. 14).

Referring to FIG. 14, reference numeral 1300 which has not been described refers to a black matrix, and 1124 refers to a connection pad.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. A display apparatus comprising:
 a base substrate having a data line disposed on a first side thereof;
 a plurality of pixel modules arranged in a matrix format on the first side of the base substrate; and
 a driving driver configured to provide a data signal in a digital format through the data line to each of the plurality of pixel modules,
 wherein each of the plurality of pixel modules comprises:
  a light emitting layer in which a plurality of light emitting diode (LED) devices are disposed to form a pixel,
  a driving layer comprising a display driver integrated circuit (DDI) formed below the light emitting layer configured to generate a driving signal to drive the plurality of LED devices, and
  a substrate layer, formed between the driving layer and the base substrate, comprising a data input pad configured to receive the data signal and transmit the data signal to the DDI and a data output pad configured to provide the data signal to another adjacent pixel module.

2. The display apparatus of claim 1, wherein the data line comprises a plurality of sub data lines configured to transmit the data signal from a data output pad of one pixel module among the plurality of pixel modules to a data input pad of another adjacent pixel model.

3. The display apparatus of claim 2, wherein the plurality of sub data lines are segmented from each other and disposed on the base substrate distantly.

4. The display apparatus of claim 2, further comprising:
a power line configured to supply power to the plurality of pixel modules,
wherein the power line and the data line are provided on a wiring layer formed on the first side of the base substrate.

5. The display apparatus of claim 4, wherein the power line and the data line are provided on the wiring layer so that the base substrate has a one-layer structure.

6. The display apparatus of claim 4, wherein the wiring layer comprises the plurality of sub data lines being segmented and distantly disposed in a row direction in the matrix format, the power line being arranged in a column direction in the matrix format.

7. The display apparatus of claim 6, wherein the power line is disposed between the plurality of sub data lines.

8. The display apparatus of claim 4, wherein the wiring layer comprises a plurality of wiring members comprising copper (Cu), aluminum (Al), tin (Sn), iron (Fe), or an alloy including one of these.

9. The display apparatus of claim 1, wherein the substrate layer comprises:
a first layer facing the base substrate and having the data input pad and the data output pad being located therein,
a second layer located on an opposite side of the first side and facing the driving layer, and
an intermediate layer in which a plurality of via holes that pass through the first layer and the second layer.

10. The display apparatus of claim 9, wherein the intermediate layer is made of polyimide material, and the substrate layer includes a two-layer structure.

11. The display apparatus of claim 9, wherein the substrate layer has thickness between 45 μm and 55 μm.

12. The display apparatus of claim 1,
wherein the driving layer comprises a light blocking molding to block transmission of light, and
wherein the light blocking molding is coated on an upper surface of the DDI.

13. The display apparatus of claim 12, wherein the light blocking molding is implemented as a black color to block light.

14. The display apparatus of claim 1, further comprising a black matrix formed between the plurality of LED devices.

15. The display apparatus of claim 1, further comprising a protective layer comprising an optical film over the black matrix and the plurality of LED devices.

16. The display apparatus of claim 1,
wherein each of the plurality of pixel modules comprises a plurality of red LED (R-LED) devices, a plurality of green LED (G-LED) devices, and a plurality of blue LED (B-LED) devices, and
wherein one pixel module forms a plurality of pixels.

17. The display apparatus of claim 16,
wherein each of the plurality of pixel modules comprises six pixels arranged in a 2×3 matrix, and
wherein each of the pixels comprises one R-LED device, one G-LED device, and one B-LED device.

18. The display apparatus of claim 1, wherein the base substrate comprises a flexible printed circuit board (FPCB) at least a portion of which is flexible.

19. The display apparatus of claim 1, wherein the plurality of LED devices are arranged at a constant pixel pitch in an X-axis direction and a Y-axis direction.

20. A method of manufacturing a display apparatus, the method comprising:
forming a substrate comprising a data input pad configured to receive the data signal and a data output pad configured to provide a data signal;
transferring a display driver integrated circuit (DDI) to an upper surface of the substrate layer;
coating a light blocking molding onto the upper surface of the substrate layer and the upper surface of the DDI, and forming a driving layer by wiring a plurality of light emitting diode (LED) devices to be bonded;
forming a light emitting layer by mounting the plurality of LED devices on the driving layer; and
transferring a plurality of pixel modules formed of the substrate layer, the driving layer, and the light emitting layer to a base substrate in a matrix form.

* * * * *